United States Patent
Ip

(10) Patent No.: US 11,594,431 B2
(45) Date of Patent: Feb. 28, 2023

(54) WAFER BONDING APPARATUS AND METHODS TO REDUCE POST-BOND WAFER DISTORTION

(71) Applicant: Tokyo Electron Limited, Tokyo (JP)

(72) Inventor: Nathan Ip, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/236,785

(22) Filed: Apr. 21, 2021

(65) Prior Publication Data

US 2022/0344179 A1   Oct. 27, 2022

(51) Int. Cl.
    *H01L 21/67*   (2006.01)
(52) U.S. Cl.
    CPC ............... *H01L 21/67092* (2013.01)
(58) Field of Classification Search
    CPC .................................. H01L 21/67092
    See application file for complete search history.

(56) References Cited

U.S. PATENT DOCUMENTS

| | | | |
|---|---|---|---|
| 6,451,670 B1 * | 9/2002 | Takisawa | H01L 21/2007 |
| | | | 438/455 |
| 9,312,161 B2 | 4/2016 | Wimplinger et al. | |
| 9,754,813 B2 | 9/2017 | Huang et al. | |
| 10,170,447 B2 | 1/2019 | Lin et al. | |
| 10,906,283 B2 | 2/2021 | Kim et al. | |
| 2006/0292822 A1 * | 12/2006 | Xie | H01L 21/187 |
| | | | 438/455 |
| 2009/0000552 A1 * | 1/2009 | Soh | H01L 21/67288 |
| | | | 118/728 |
| 2012/0006463 A1 * | 1/2012 | Gaudin | H01L 24/94 |
| | | | 156/60 |

FOREIGN PATENT DOCUMENTS

EP     3742474 A1    11/2020

* cited by examiner

*Primary Examiner* — Daniel McNally
(74) *Attorney, Agent, or Firm* — Egan, Enders & Huston LLP.

(57) ABSTRACT

Various embodiments of wafer bonding apparatuses and methods are described herein for reducing distortion in a post-bonded wafer pair. More specifically, the present disclosure provides embodiments of wafer bonding apparatuses and methods to reduce post-bond wafer distortion that occurs primarily within the center and/or the edge of the post-bonded wafer pair. In the present disclosure, post-bonded wafer distortion is reduced by correcting for variations in the pre-bond wafer shapes. Variations in pre-bond wafer shape are corrected, or compensated for, by making hardware modifications to the wafer chuck. Such modifications may include, but are not limited to, modifications to the surface height and/or the temperature of the wafer chuck. Although hardware modifications are disclosed herein for reducing post-bond wafer distortion near the center and/or the edge of the post-bonded wafer pair, similar modifications can be made to reduce post-bond wafer distortion within other areas or zones of the post-bonded wafer pair.

20 Claims, 11 Drawing Sheets

WAFER BONDING APPARATUS AND METHODS TO REDUCE POST-BOND WAFER DISTORTION

BACKGROUND

The present disclosure relates to the processing of substrates. In particular, it provides an improved chuck design and wafer bonding process that reduces post-bond wafer distortion.

A wafer bonding apparatus (or "wafer bonder") physically joins two wafers (an upper wafer and a lower wafer) together through interfacial adhesion. The lateral misalignment along the bonding interface is referred to as the post-bond distortion error. The post-bond distortion error is a function of the pre-bond wafer shapes and the wafer bonding process (e.g., the tool recipe), and is often used to judge the performance of the wafer bonding apparatus.

There are two main types of wafers used in wafer bonding processes: device/device pair and device/carrier pair. A device wafer is a patterned wafer with nanoscale electrical circuits created on the surface of the wafer. A carrier wafer is typically a blank wafer without any patterns on the surface of the wafer. For a device/device wafer pair, the absolute lateral misalignment between the two wafers anywhere along the bonding interface is critical, and may typically be around 100 nm for state-of-the-art technology. In contrast, the relative lateral misalignment is more important in a device/carrier wafer pair. Since there are no patterns in a carrier wafer, the absolute lateral misalignment between the two bonded wafers is affected by the ability of the lithography tool to pattern the carrier wafer in subsequent processing step(s). This misalignment can be corrected, at least partially, by the lithography tool. Therefore, the relative lateral misalignment for a device/carrier wafer pair is the absolute misalignment minus the correction that can be applied in subsequent processing step(s). Depending on the correction capability of the subsequent step(s), the relative lateral misalignment between a device/carrier wafer pair may be less than 10 nm for state-of-the-art technology. The absolute and relative lateral misalignments will be referred to as "distortion" in the following paragraphs.

FIGS. 1A-1C (Prior Art) illustrate a conventional wafer bonding apparatus 10 and process that may be used to bond two wafers together. The wafer bonding apparatus 10 includes an upper chuck 12 and a lower chuck 14, which hold an upper wafer 16 and lower wafer 18 in place, respectively. In some cases, vacuum pressure may be used to hold the wafers on the chucks. As shown in FIG. 1A, the two wafers are initially separated by a small gap (g). Next, the center of the upper and lower wafers are pushed into contact, sometimes assisted by a mechanical force applied to the center of the upper wafer 16. As shown in FIG. 1B, for example, a striker pin (or bonding pin) 19 may be used to apply a mechanical force to the center of the upper wafer 16, which causes the upper wafer to bow or bend until the center of the upper wafer 16 makes contact with the center of the lower wafer 18. This contact initiates a bonding front that spontaneously propagates radially outward from the center of the upper and lower wafers. As the contact surface area increases, the upper and lower wafers elastically deform in order to close the initial gap (g) between the wafers. The vacuum pressure to the upper chuck 12 is turned off. When the contact surface area is large enough, the vacuum seal between the upper chuck 12 and upper wafer 16 breaks, due to either the deformation of wafers or the predetermined recipe setting. The bonding front continues to propagate outwards until the two wafers are fully bonded. Once the bond is complete, the striker pin 19 retracts and the vacuum pressure to the lower chuck 14 is turned off, as shown in FIG. 1C. The post-bonded wafer pair 16/18 may then be released from the wafer bonding apparatus 10, sent to a metrology tool for distortion characterization and/or continue on to the next processing step.

In some cases, the conventional wafer bonding apparatus 10 and process shown in FIGS. 1A-1C may result in poor post-bonded wafer distortion near the center and/or the edge (e.g., within the outermost 15 mm) of the post-bonded wafer pair 16/18. Specifically, FIG. 1C illustrates an upward bending of the post-bonded wafer pair 16/18 near the edge or outer periphery of the post-bonded wafer pair. The upward bending shown in FIG. 1C is one example of post-bonded wafer distortion (e.g., an outward distortion) that may occur after a conventional wafer bonding process is used to bond two wafers together. Distortion may also occur within other regions (e.g., near the center) of the post-bonded wafer pair when a conventional wafer bonding process is used. Regardless of location, post-bonded wafer distortion causes a lateral shift (or lateral misalignment) between the two wafers in the area of distortion.

The post-bonded wafer distortion shown in FIG. 1C may be due to a number of reasons. First, pre-bonded wafers typically have different specifications near the edge. For example, some wafers may have a tapered edge, or a smaller thickness near the edge or outer periphery (e.g., the outermost 3 mm) of the wafer. This leads to a difference in the mechanical performance of the wafer at/near the edge (compared to the rest of the wafer), which may lead to poor distortion in the post-bonded wafer pair. In addition, pre-bonded wafers may be processed differently in other processing steps (e.g., different patterning arrangements) to improve device yield. The difference in process often results in different pre-bonded wafer shapes near the edge or outer periphery. Variations in pre-bonded wafer shape is another cause of post-bonded wafer distortion. Furthermore, a wafer bonding process can be conceived as a two-phase process—before and after the chuck vacuum seal is broken. Once the vacuum seal is broken between the chuck and the wafer, there are fewer distortion controls from the wafer bonding apparatus, which may result in poor distortion at the edge.

FIG. 2 is a graph illustrating distortion of a post-bonded wafer pair (i.e., post-bond wafer distortion) as a function of radius (r) when a conventional wafer bonding apparatus and process is used to bond two wafers together, as discussed above for example in reference to FIGS. 1A-1C. In the graph shown in FIG. 2, the distortion 20 increases significantly near the edge of the post-bonded wafer pair. In some wafer bonding processes, the distortion 20 near the edge of the post-bonded wafer pair can be up to, e.g., 20 nm worse than the distortion 20 across the rest of the wafer pair. It is estimated that the post-bond distortion error can improve, e.g., by 15% or more, when wafer edge distortion is improved.

SUMMARY

Various embodiments of wafer bonding apparatuses and methods are described herein for reducing distortion in a post-bonded wafer pair. In many cases, the post-bond wafer distortion may be worse near the center and/or near the edge of the post-bonded wafer pair, as shown in FIG. 2 and discussed above. For this reason, the present disclosure provides embodiments of wafer bonding apparatuses and methods to reduce post-bond wafer distortion that occurs primarily within the center and/or the edge of the post-bonded wafer pair. In the present disclosure, post-bonded wafer distortion is reduced by correcting for variations in the pre-bond wafer shapes. Variations in pre-bond wafer shape are corrected, or compensated for, by making hardware modifications to the wafer chuck. Such modifications may include, but are not limited to, modifications to the surface height and/or the temperature of the wafer chuck. Although hardware modifications are disclosed herein for reducing post-bond wafer distortion near the center and/or the edge of the post-bonded wafer pair, similar modifications can be made to reduce post-bond wafer distortion within other areas, or zones, of the post-bonded wafer pair.

According to one embodiment, a wafer bonding apparatus may generally include a first chuck comprising a first mounting surface configured to retain a first wafer, and a second chuck comprising a second mounting surface configured to retain a second wafer. In this embodiment, the second chuck may include a center region, a peripheral region extending radially outward from an edge of the center region to an outer edge of the second chuck and a plurality of radial ribs that extend vertically from an upper surface of the second chuck to provide the second mounting surface. The second mounting surface is flat within the center region and linearly inclined or linearly declined within the peripheral region, so that a height of the second chuck within the peripheral region is different than the height of the second chuck within the center region.

In some embodiments, the second mounting surface may be linearly declined within the peripheral region, so that the height of the second chuck within the peripheral region is less than the height of the second chuck within the center region. In some embodiments, a height differential between the edge of the center region and the outer edge of the second chuck may be selected from a range including −1 μm to −5 μm, for example. In some embodiments, one or more radial ribs of the plurality of radial ribs may be located within the peripheral region. In some embodiments, the height differential is provided by reducing a height of the one or more radial ribs located within the peripheral region.

In some embodiments, the second mounting surface may be linearly inclined within the peripheral region, so that the height of the second chuck within the peripheral region is greater than the height of the second chuck within the center region. In some embodiments, a height differential between the edge of the center region and the outer edge of the second chuck may be selected from a range including +1 μm to +5 μm, for example. In some embodiments, one or more radial ribs of the plurality of radial ribs may be located within the peripheral region. In some embodiments, the height differential is provided by increasing a height of the one or more radial ribs located within the peripheral region.

According to another embodiment, a wafer bonding apparatus may generally include a first chuck comprising a first mounting surface configured to retain a first wafer, and a second chuck comprising a second mounting surface configured to retain a second wafer. Like the previous embodiment, the second chuck may also include a center region and a peripheral region that extends radially outward from an edge of the center region to an outer edge of the second chuck. In this embodiment, however, the second chuck may further include a plurality of radial zones extending radially outward from a center of the second chuck to an outer edge of the second chuck. A first subset of the plurality of radial zones may be located within the center region of the second chuck. A second subset of the plurality of radial zones may be located within the peripheral region of the second chuck. A height of the second chuck within one or more of the radial zones may differ from the height of the second chuck within the other radial zones.

In some embodiments, the second chuck may further a plurality of radial ribs, each located at a boundary between two of the radial zones and extending vertically from an upper surface of the second chuck to provide the second mounting surface. A first subset of the plurality of radial ribs may be located within the first subset of the plurality of radial zones. A second subset of the plurality of radial ribs may be located within the second subset of the plurality of radial zones. A height of the second subset of the plurality of radial ribs may differ from a height of the first subset of the plurality of radial ribs.

In some embodiments, the second mounting surface may be flat or planar across the first subset of the plurality of radial ribs, and linearly declined or linearly inclined across the second subset of the plurality of radial ribs.

In one embodiment, for example, the second mounting surface may be linearly declined or angled downward across the second subset of the plurality of radial ribs, so that the height of the second chuck at the outer edge of the second chuck is less than the height of the second chuck within the center region. In such an embodiment, a height decrease within the peripheral region of the second chuck may cause peripheral portions of the second wafer to bend in a downward direction prior to bonding. When bonding between the first wafer and the second wafer is complete, the peripheral portions of the second wafer may bend in an upward direction to provide an inward distortion, which reduces lateral misalignment between the first wafer and the second wafer.

In another embodiment, the second mounting surface may be linearly inclined or angled upward across the second subset of the plurality of radial ribs, so that the height of the second chuck at the outer edge of the second chuck is greater than the height of the second chuck within the center region. In such an embodiment, a height increase within the peripheral region of the second chuck may cause peripheral portions of the second wafer to bend in an upward direction prior to bonding. When bonding between the first wafer and the second wafer is complete, the peripheral portions of the second wafer may bend in a downward direction to provide an outward distortion, which reduces lateral misalignment between the first wafer and the second wafer.

In some embodiments, at least one of the first chuck and the second chuck may include one or more temperature regulation elements embedded within one or more radial zones of the plurality of radial zones. In some embodiments, the one or more temperature regulation elements may be configured to transfer heat to a region of the first wafer and/or the second wafer overlying the one or more radial zones, which causes the region of the first wafer and/or the second wafer to laterally expand and create an outward distortion that reduces lateral misalignment between the first wafer and the second wafer. In other embodiments, the one or more temperature regulation elements may be configured to transfer heat from a region of the first wafer and/or the second wafer overlying the one or more radial zones, which causes the region of the first wafer and/or the second wafer to laterally contract and create an inward distortion that reduces lateral misalignment between the first wafer and the second wafer.

According to another embodiment, a method is provided to reduce distortion in a post-bonded wafer pair. The method may generally include receiving an upper wafer on a mounting surface of an upper chuck of a wafer bonding apparatus and supplying a vacuum pressure to the upper chuck to retain the upper wafer on the mounting surface of the upper chuck. The method may further include receiving a lower wafer on a mounting surface of a lower chuck of the wafer bonding apparatus and supplying a vacuum pressure to the lower chuck to retain the lower wafer on the mounting surface of the lower chuck. The method may further include bonding the upper wafer to the lower wafer to form a post-bonded wafer pair.

In some embodiments of the disclosed method, the lower chuck may comprise a center region and a peripheral region extending radially outward from an edge of the center region to an outer edge of the lower chuck. The mounting surface of the lower chuck may be flat within the center region and linearly inclined or linearly declined within the peripheral region, so that a height of the lower chuck within the peripheral region is different than the height of the lower chuck within the center region. When vacuum pressure is supplied to the lower chuck, the vacuum pressure supplied to the lower chuck causes the lower wafer to adhere to the mounting surface of the lower chuck, so that the lower wafer is pre-distorted by a shape of the mounting surface of the lower chuck before the upper wafer is bonded to the lower wafer. The pre-distortion of the lower wafer prior to bonding advantageously reduces distortion in the post-bond wafer pair and minimizes lateral misalignment between the upper wafer and the lower wafer.

In some embodiments of the disclosed method, the upper chuck may comprise a center region and a peripheral region extending radially outward from an edge of the center region to an outer edge of the upper chuck. The mounting surface of the upper chuck may be flat within the center region and linearly inclined or linearly declined within the peripheral region, so that a height of the upper chuck within the peripheral region is different than the height of the upper chuck within the center region. When vacuum pressure is supplied to the upper chuck, the vacuum pressure supplied to the upper chuck causes the upper wafer to adhere to the mounting surface of the upper chuck, so that the lower wafer is pre-distorted by a shape of the mounting surface of the upper chuck before the lower wafer is bonded to the upper wafer. The pre-distortion of the upper wafer prior to bonding advantageously reduces distortion in the post-bond wafer pair and minimizes lateral misalignment between the upper wafer and the lower wafer.

In some embodiments, the bonding step may include applying a mechanical force to a center of the upper wafer to initiate bonding between the upper wafer and the lower wafer, removing the vacuum pressure supplied to the upper chuck before the bonding between the upper wafer and the lower wafer is complete, and removing the vacuum pressure supplied to the lower chuck after the bonding between the upper wafer and the lower wafer completes to form the post-bonded wafer pair. In such embodiments, the post-bonded wafer pair may remain on the lower chuck until the vacuum pressure supplied to the lower chuck is removed.

In other embodiments, the bonding step may include applying a mechanical force to a center of the upper wafer to initiate bonding between the upper wafer and the lower wafer, removing the vacuum pressure supplied to the lower chuck before the bonding between the upper wafer and the lower wafer is complete, and removing the vacuum pressure supplied to the upper chuck after the bonding between the upper wafer and the lower wafer completes to form the post-bonded wafer pair. In such embodiments, bonding forces between the upper wafer and the lower wafer cause a vacuum seal between the lower wafer and the lower chuck to break before bonding completes and/or before the vacuum pressure supplied to the upper chuck is removed. In such embodiments, the post-bonded wafer pair may remain on the upper chuck until the vacuum pressure supplied to the upper chuck is removed.

Different or additional features, variations, and embodiments can also be implemented, and related systems and methods can be utilized as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Silicon wafers are commonly processed in lots containing, for example, up to 25 wafers. Wafers typically vary from one lot to another, due to processing conditions, intrinsic wafer deformation, and other less obvious factors. This variation can be local, meaning the averaged surface map of one lot differs from another lot, with one standard deviation of shape variation ranging from 1 µm up to 5 µm in logic devices. The variation can also be global, meaning the peak-to-valley variation can be on the order of 10 µm from one lot to another. Lot-to-lot wafer variation is a significant contributor to post-bond wafer distortion. In the present disclosure, lot-to-lot wafer variation is minimized by correcting for variations in the pre-bond wafer shapes.

Variations in the pre-bond wafer shape is directly correlated to the in-plane distortion or lateral misalignment produced between two wafers in a post-bonded wafer pair. In one example, 1 µm of pre-bonded wafer shape variation may result in approximately 5 nm of distortion. The amount of distortion in a post-bonded wafer pair (i.e., the post-bond distortion error) is a critical metric often used to judge the performance of the wafer bonding apparatus and process. Thus, it is generally desirable to reduce the amount of distortion in a post-bonded wafer pair.

The present disclosure provides various embodiments of wafer bonding apparatuses and methods for reducing distortion in a post-bonded wafer pair. In the disclosed embodiments, post-bonded wafer distortion is reduced by correcting for variations in the pre-bond wafer shapes. A variety of hardware improvements are used herein to correct for variations in the pre-bond wafer shapes. The design of the hardware is driven by physical modeling of a particular wafer bonding process. The physical models provide guidelines to the unique hardware designs at specific locations (e.g., near the edge and/or center of the wafer) to counteract poor distortion areas within a post-bonded wafer pair.

Figure 2:
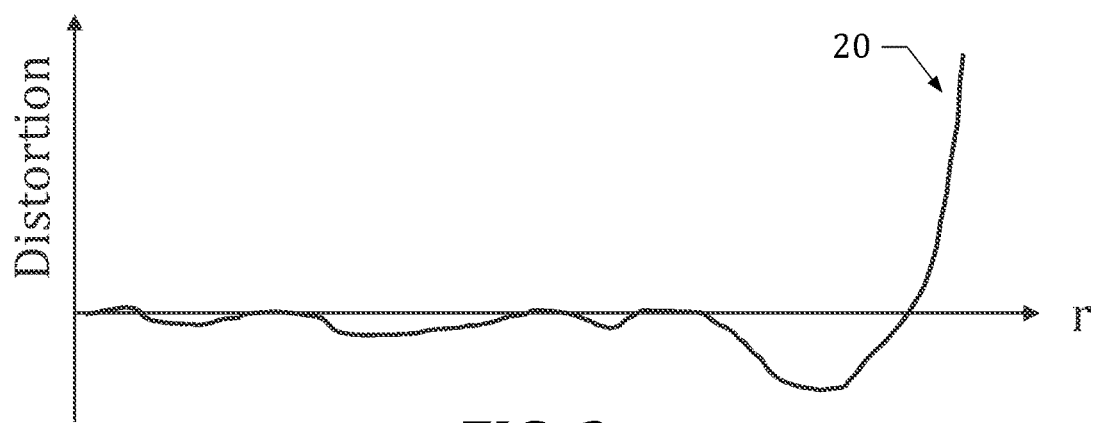
FIG. 2 (Prior Art) is a graph illustrating distortion of a post-bonded wafer pair as a function of radius (r) when a conventional wafer bonding apparatus and process is used to bond two wafers together.

In many cases, the post-bond wafer distortion may be worse near the center of the wafer (e.g., due to the striker bonding pin design) and/or near the edge of wafer, as shown in FIG. 2 and discussed above. For this reason, the present disclosure provides various embodiments of wafer bonding apparatuses and methods to reduce post-bond wafer distortion that occurs primarily within the center and/or the edge of the wafer. Such embodiments may include, but are not limited to, modifications to the surface height and/or the temperature of the wafer chuck. Although hardware modifications are disclosed herein for reducing post-bond wafer distortion near the center and/or the edge of the post-bonded wafer pair, one skilled in the art would recognize how similar modifications can be made to reduce post-bond wafer distortion within other areas or zones of the post-bonded wafer pair.

Figure 3:
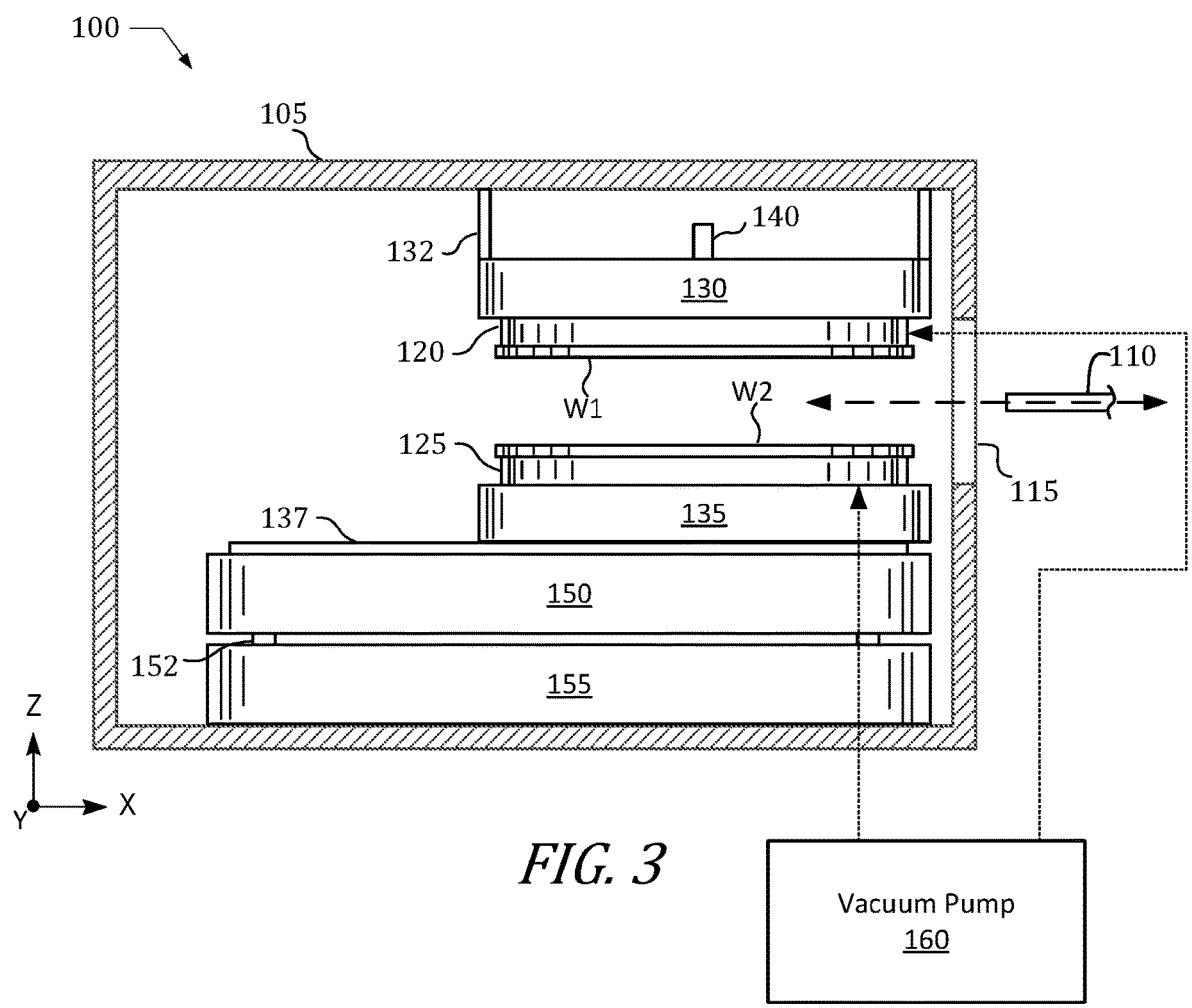
FIG. 3 is a side view of an example wafer bonding apparatus in which the techniques described herein may be utilized.

FIG. 3 illustrates one example of a wafer bonding apparatus 100 in which the techniques described herein may be utilized. In some embodiments, the wafer bonding apparatus 100 shown in FIG. 3 may be a wafer bonding module included within a wafer bonding system or another substrate processing system. In other embodiments, the wafer bonding apparatus 100 shown in FIG. 3 may be a stand-alone module configured to bond two wafers together. It is recognized that, although an example wafer bonding apparatus 100 is shown for illustrative purposes, the techniques described herein are not limited to the particular configuration shown in FIG. 3.

Wafer bonding apparatus 100 is used to bond two semiconductor substrates together, such as a first wafer (W1) and a second wafer (W2). In some embodiments, the first wafer W1 and the second wafer W2 may have substantially the same diameter (e.g., 300 mm, in one embodiment). In some embodiments, the first wafer W1 may be semiconductor substrate, such as a silicon wafer or a compound semiconductor wafer on which multiple electronic circuits are formed (i.e., a device wafer) and the second substrate W2 may be bare wafer on which no electronic circuits are formed (i.e., a carrier wafer). In other embodiments, the first wafer W1 and the second wafer W2 may each be device wafers. In the following description, the first wafer W1 may alternatively be referred to as an "upper wafer" and the second wafer W2 may be alternatively referred to as a "lower wafer." When the first wafer W1 is bonded to the second wafer W2, the combined substrate may be referred to as a "post-bonded wafer pair."

As shown in FIG. 3, the wafer bonding apparatus 100 includes a processing chamber 105 for bonding the first wafer W1 to the second wafer W2. In some embodiments, the first and second wafers can be delivered to the processing chamber 105 by a processing arm 110, which may be configured to transfer the wafers into/out of the processing chamber 105 via an opening 115 provided within a sidewall of the processing chamber. In order to transfer the wafers into/out of the processing chamber 105, the processing arm 110 may be configured to move in the vertical direction (Z-direction) and the horizontal directions (X-direction and Y-direction). In some cases, the processing arm 110 may also be pivotable around the vertical axis for transferring the first wafer W1 and the second wafer W2 into the processing chamber 105 and transferring the post-bonded wafer pair out of the processing chamber 105.

The processing chamber 105 generally includes an upper chuck 120 for receiving and retaining the first wafer (or upper wafer) W1 and a lower chuck 125 for receiving and retaining the second wafer (or lower wafer) W2. The upper chuck 120 is supported by a supporting member 130, which may be coupled to a ceiling of the processing chamber 105 by a plurality of support columns 132, as shown in FIG. 3. As described in more detail below with reference to FIGS. 4A-4C, a hole 134 is formed within and extends vertically through the supporting member 130 and the upper chuck 120. The hole 134 is positioned so as to correspond to a central region or zone of the upper wafer W1 held by the upper chuck 120. A bonding pin of a striker 140 is inserted through the hole 134 and used to provide a mechanical force to the upper wafer W1 during the wafer bonding process.

In the wafer bonding apparatus 100 shown in FIG. 3, the lower chuck 125 is supported by a first lower chuck mover 135 and a second lower chuck mover 150, which are provided below the lower chuck 125 for translating or moving the lower chuck 125 in the horizontal directions. For example, a bottom surface of the first lower chuck mover 135 is coupled to a first pair of rails 137, which are mounted to an upper surface of the second lower chuck mover 150, so as to extend in a first horizontal direction (e.g., the X-axis direction). Likewise, a bottom surface of the second lower chuck mover 150 is coupled to a second pair of rails 152, which are mounted to a placing table 155, so as to extend in a second horizontal direction (e.g., the Y-axis direction). The placing table 155 is coupled to the bottom of the processing chamber 105 in the embodiment shown in FIG. 3.

When arranged as shown in FIG. 3, the first lower chuck mover 135 is configured to move along the first pair of rails 137 to translate the lower chuck 125 (and the lower wafer W2) in the X-direction. Likewise, the second lower chuck mover 150 is configured move along the second pair of rails 152 to translate the lower chuck 125 (and the lower wafer W2) in the Y-direction. After the upper wafer W1 and lower wafer W2 are provided to the upper and lower chucks, the first lower chuck mover 135 and the second lower chuck mover 150 may be used to translate the lower chuck 125 (and the lower wafer W2) in the X- and/or Y-directions until the lower wafer W2 is aligned with the upper wafer W1. In some embodiments, the first lower chuck mover 135 and the second lower chuck mover 150 may also be used to translate the lower chuck 125 in the Z-direction.

In some embodiments, the upper chuck 120 and the lower chuck 125 may be vacuum chucks. Once the upper wafer W1 and the lower wafer W2 are transferred into the processing chamber 105, a vacuum pump 160 may be turned on to provide a vacuum pressure (i.e., a negative pressure) sufficient to retain the upper wafer W1 on the upper chuck 120 and the lower wafer W2 on the lower chuck 125. As described in more detail below with reference to FIGS. 4A-4C, the upper chuck 120 and the lower chuck 125 may each have a mounting surface comprising a plurality of holes through which the vacuum pressure is created between the mounting surface of the chuck and a backside surface of the wafer. When a wafer is placed on the vacuum chuck and the vacuum pump 160 is turned on, the vacuum pressure provided by the vacuum pump 160 creates a vacuum seal between the backside surface of wafer and the mounting surface of the chuck to retain the wafer on the chuck. Although described in the context of vacuum chucks, one skilled in the art would recognize that other types of chucks (e.g., electrostatic, magnetic, etc.) may also be used to implement the upper chuck 120 and the lower chuck 125 shown in FIG. 3 while utilizing the techniques described herein.

Figure 4A:
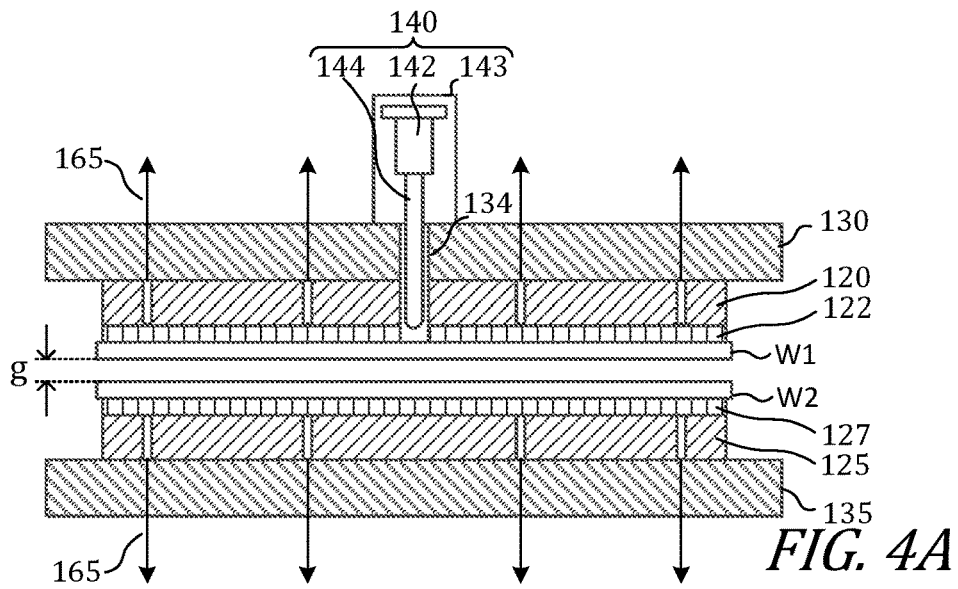
FIGS. 4A-4C are cross-sectional views through the upper chuck and lower chuck subassemblies shown in FIG. 3, illustrating various wafer bonding process steps that may be performed by the example wafer bonding apparatus.
Figure 4B:
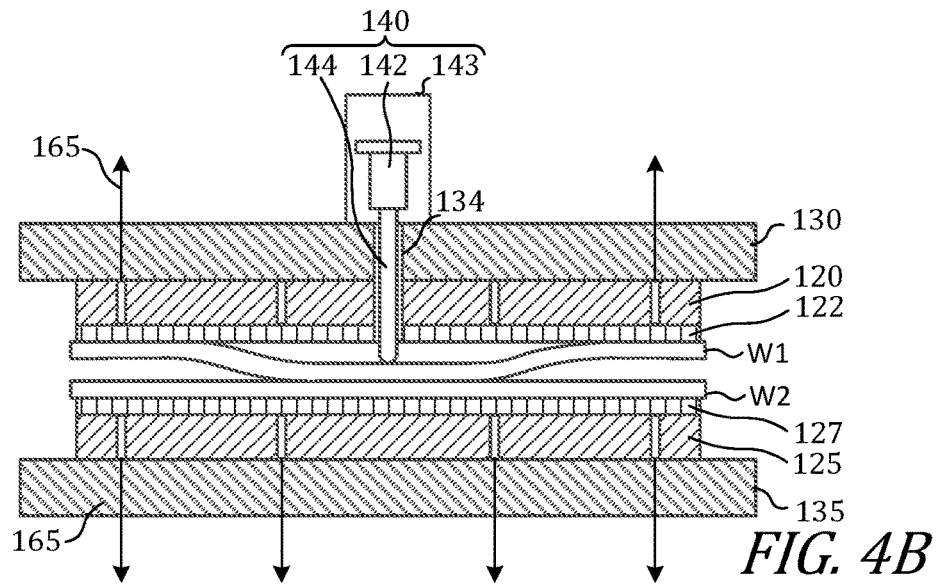
Figure 4C:
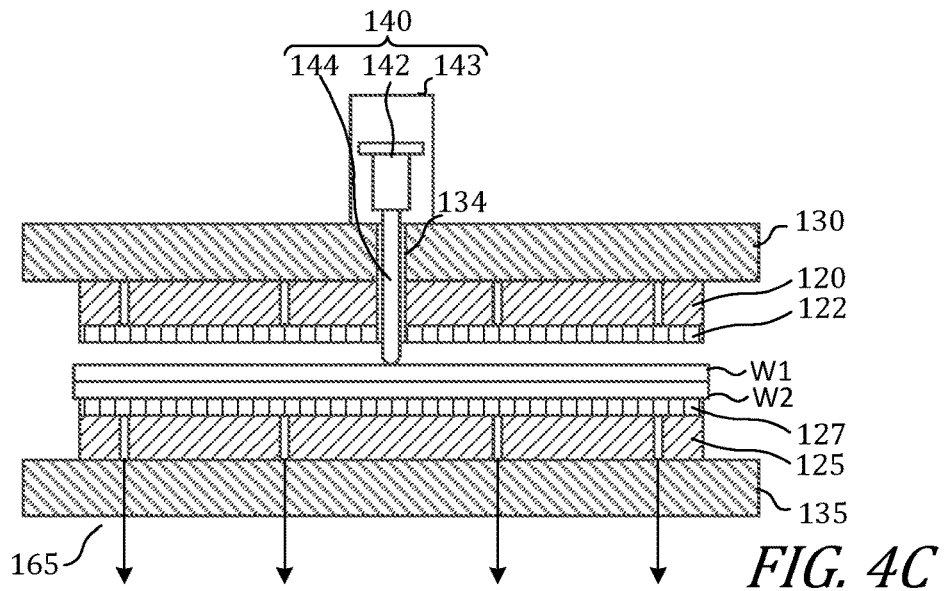

FIGS. 4A-4C are cross-sectional views through the upper chuck and lower chuck subassemblies shown in FIG. 3. As shown in FIG. 4A, the striker 140 provided within the upper chuck subassembly (comprising, e.g., upper chuck 120 and supporting member 130) is equipped with a bonding pin 144, an actuator unit 142 and a linearly moving mechanism 143. The bonding pin 144 is a columnar member, which is supported by the actuator unit 142 and extends along the vertical direction through the hole 134 formed within the upper chuck subassembly.

The actuator unit 142 is supported by the linearly moving mechanism 143. The linearly moving mechanism 143 moves the actuator unit 142 and the bonding pin 144 up and down in the vertical direction by a driving unit (not shown), which may include, e.g., a motor. The actuator unit 142 is configured to generate a constant pressure in the vertically downward direction. In one example, the actuator unit 142 may generate the constant pressure using air supplied, for example, from an electro-pneumatic regulator (not shown). In this manner, the actuator unit 142 is capable of controlling a mechanical force applied to the central portion of the upper wafer W1 when the bonding pin 144 is brought into contact with the central portion of the upper wafer W1. When configured as described above, the striker 140 controls a movement of the actuator unit 142 by the linearly moving mechanism 143 and the mechanical force exerted upon the upper wafer W1 from the bonding pin 144 by the actuator unit 142.

FIGS. 4A-4C illustrate various wafer bonding process steps that may be performed by the wafer bonding apparatus 100. As shown in FIG. 4A, the upper wafer W1 and the lower wafer W2 are retained by the upper chuck 120 and the lower chuck 125, respectively. In the embodiment shown in FIGS. 3 and 4A, a backside surface of the upper wafer W1 is retained upon a mounting surface 122 of the upper chuck 120 via a vacuum pressure 165 provided by the vacuum pump 160. Likewise, a backside surface of the lower wafer W2 is retained upon a mounting surface 127 of the lower chuck 125 via the vacuum pressure 165 provided by the vacuum pump 160. The two wafers are initially separated by a small gap (g).

As shown in FIG. 4B, the striker 140 applies a mechanical force to the center of the upper wafer W1, which causes the upper wafer W1 to bow or bend until the center of the upper wafer W1 makes contact with the center of the lower wafer W2. This contact initiates a bonding front that spontaneously propagates radially outward from the center of the upper and lower wafers. As the contact surface area increases, the upper and lower wafers elastically deform in order to close the initial gap (g) between the two wafers.

In some embodiments, the vacuum pressure 165 supplied to the upper chuck 120 may be turned off before the vacuum pressure 165 to the lower chuck 125 is removed, as shown in FIG. 4C. When the vacuum pressure 165 to the upper chuck 120 is turned off first and the contact surface area is large enough, the vacuum seal between the upper chuck 120 and the upper wafer W1 breaks, the peripheral portions of the upper wafer W1 fall down toward the peripheral portions of the lower wafer W2, and the bonding front continues to propagate outwards until the two wafers are fully bonded. Once the bond is complete, the striker 140 retracts, the vacuum pressure 165 to the lower chuck 125 is turned off, and the post-bonded wafer pair W1/W2 is released from the wafer bonding apparatus 100.

In other embodiments (not shown in FIG. 4C), the vacuum pressure 165 supplied to the lower chuck 125 may be turned off before the vacuum pressure 165 to the upper chuck 120 is removed. When the vacuum pressure 165 to the lower chuck 125 is turned off first and the contact surface area is large enough, the vacuum seal between the lower chuck 125 and the lower wafer W2 breaks, the peripheral portions of the lower wafer W2 lift up toward the peripheral portions of the upper wafer W1, and the bonding front continues to propagate outwards until the two wafers are fully bonded. In this embodiment, the bonding forces between the upper wafer W1 and the lower wafer W2 may work against gravitational forces to bond the lower wafer W2 onto the upper wafer W1 retained on the upper chuck 120. Once the bond is complete, the striker 140 retracts, the vacuum pressure 165 to the upper chuck 120 is turned off, and the post-bonded wafer pair W1/W2 is released from the wafer bonding apparatus 100.

As noted above, post-bonded wafer pairs often exhibit significant distortion and lateral misalignment when conventional wafer bonding systems and methods are used to bond two wafers together. In many cases, the post-bond wafer distortion generated in such systems and methods may be worse near the center and/or near the edge of the post-bonded wafer pair, as shown in FIG. 2 and discussed above. For this reason, the present disclosure provides various embodiments of wafer bonding systems and methods to reduce post-bond wafer distortion that occurs primarily within the center and/or the edge of the post-bonded wafer pair. More specifically, the present disclosure provides a variety of hardware improvements, which reduce post-bond wafer distortion by correcting for variations in the pre-bond wafer shapes. Although hardware modifications are disclosed herein for reducing post-bond wafer distortion near the center and/or the edge of the post-bonded wafer pair, one skilled in the art would recognize how similar modifications can be made to reduce post-bond wafer distortion within other areas, or zones, of the post-bonded wafer pair.

In some embodiments, post-bonded wafer distortion is reduced by making hardware modifications to the lower chuck 125. Such modifications may include, but are not limited, to, modifications to the surface height and/or the temperature of the lower chuck 125. However, the techniques described herein are not strictly limited to the lower chuck 125. In some embodiments, similar hardware modifications may additionally or alternatively be made to the upper chuck 120.

Figure 5:
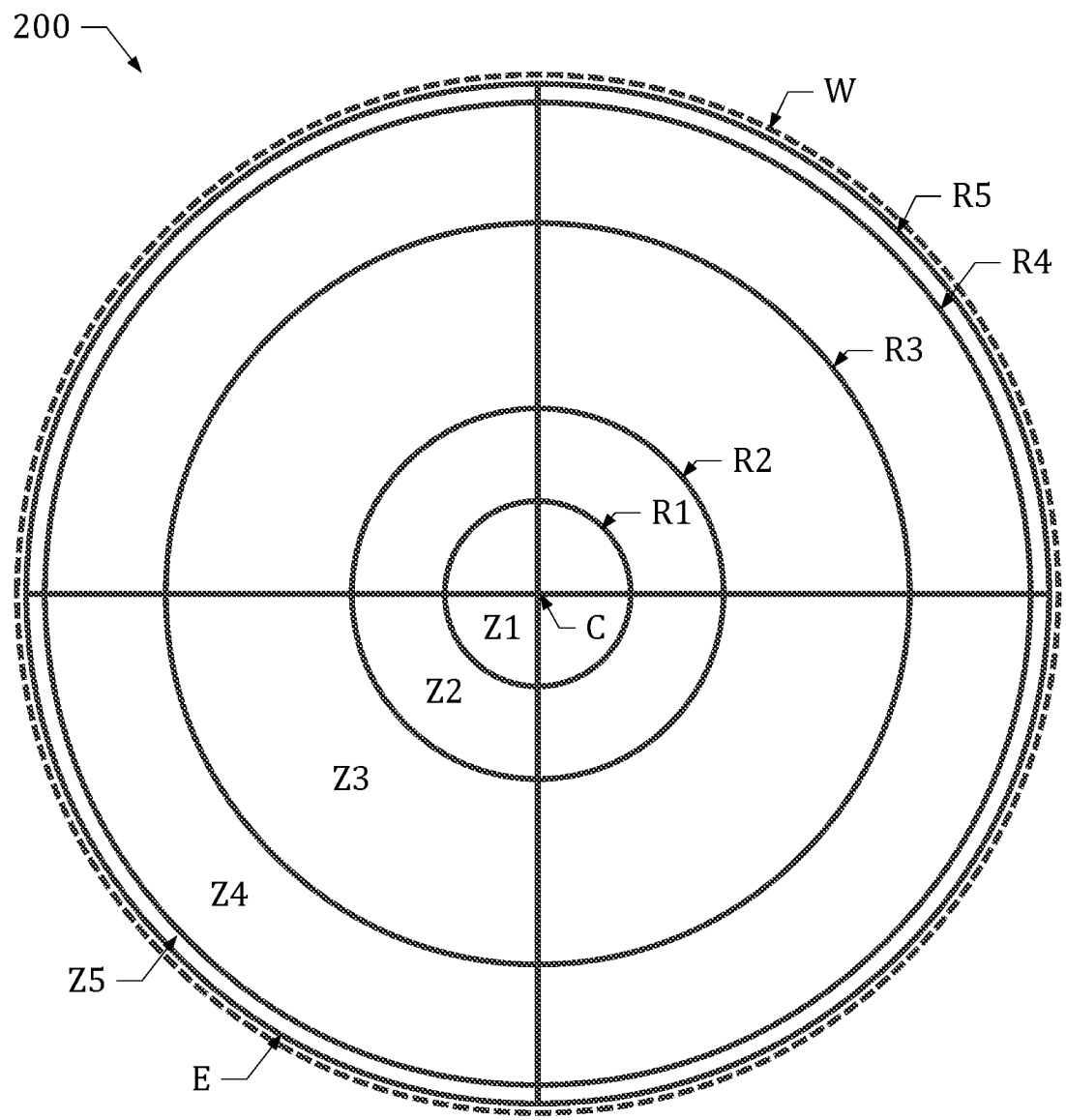
FIG. 5 is a top view of a wafer chuck in which the techniques described herein may be utilized.
Figure 6A:
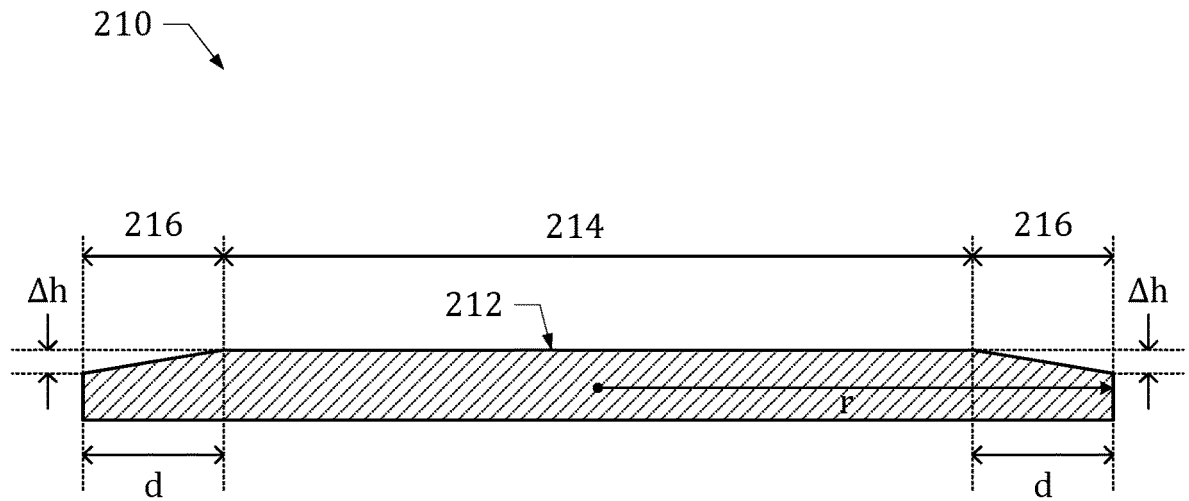
FIG. 6A is a side view of a variable height wafer chuck, according to a first embodiment of the present disclosure.
Figure 6B:
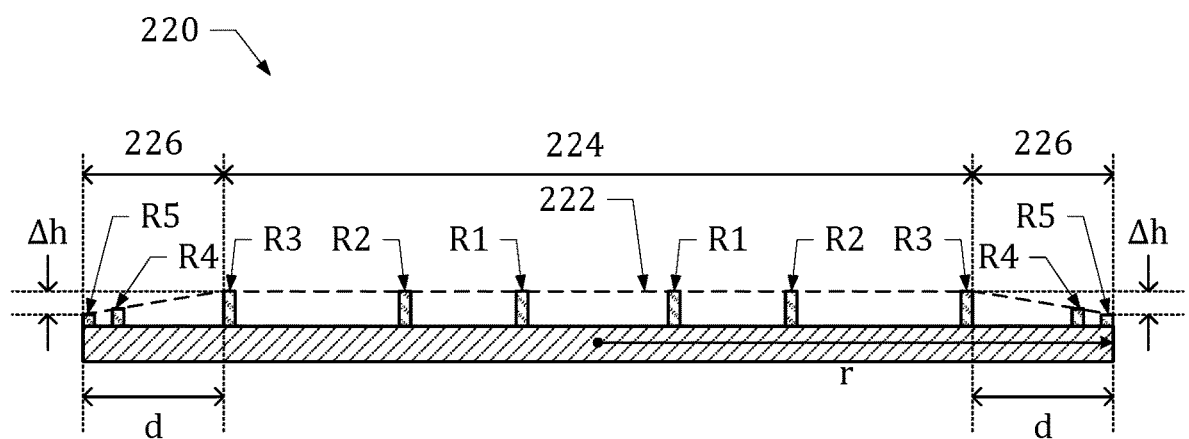
FIG. 6B is a side view of a variable height wafer chuck, according to a second embodiment of the present disclosure.
Figure 7A:
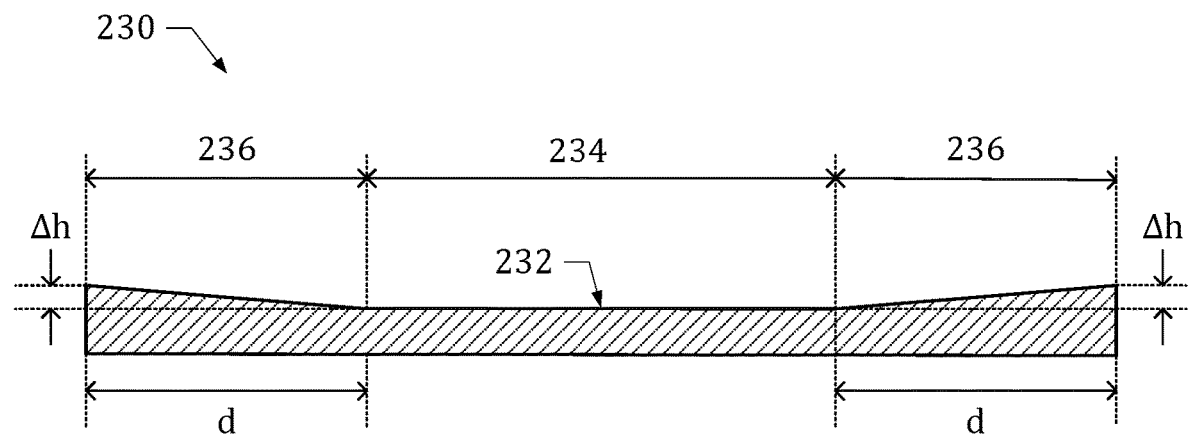
FIG. 7A is a side view of a variable height wafer chuck, according to a third embodiment of the present disclosure.
Figure 7B:
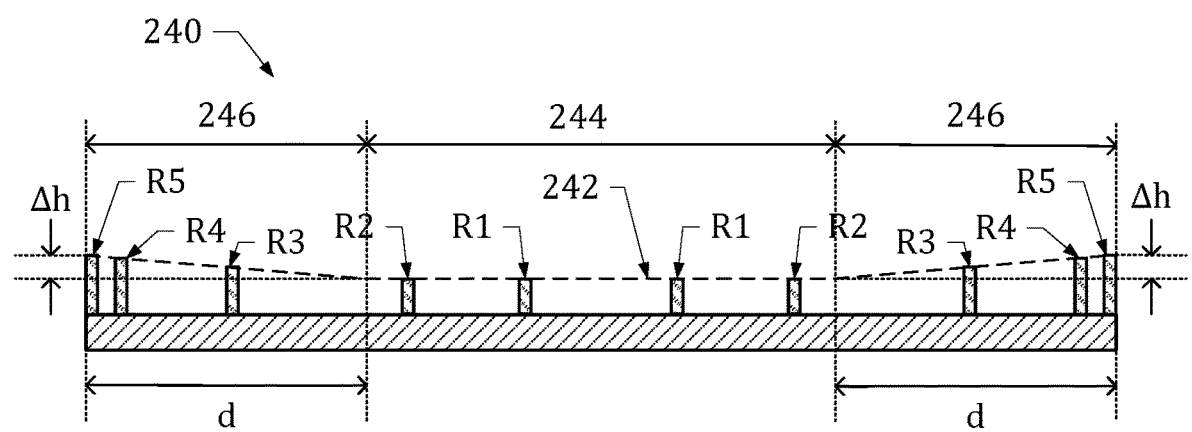
FIG. 7B is a side view of a variable height wafer chuck, according to a fourth embodiment of the present disclosure.

FIGS. 5-7 illustrate various embodiments of a wafer chuck in which the techniques described herein may be utilized. In particular, FIG. 5 illustrates a top-down view of a wafer chuck 200 comprising a plurality of radial zones (Z1-Z5) extending radially outward from a center (C) of the wafer chuck to an outer edge (E) of the wafer chuck. In some embodiments, a radial rib (R1-R5) may be provided at the boundary of each radial zone (Z1-Z5), as shown in FIG. 5. When included within the wafer chuck 200 design, the radial ribs (R1-R5) extend vertically from an upper surface of the wafer chuck to provide a mounting surface for a wafer (W). Although shown and described in various embodiments (see, e.g., FIGS. 6B, 7B and 10), it is noted that the radial ribs (R1-R5) are not strictly necessary to the techniques described herein and may be omitted in other embodiments (see, e.g., FIGS. 6A and 7A). When the radial ribs (R1-R5) are omitted, a wafer (W) may be mounted directly onto an upper surface of the wafer chuck 200, as shown for example in FIGS. 4A-4C.

In some embodiments, a surface height of the wafer chuck 200 shown in FIG. 5 may be configured to reduce post-bond wafer distortion. In particular, a surface height of the wafer chuck 200 may be varied across the wafer chuck, such that a height of the wafer chuck within one or more of the radial zones (Z1-Z5) differs from the height of the wafer chuck within the other radial zones. A wafer chuck with a variable surface height may otherwise be referred to herein as a "variable height wafer chuck." FIGS. 6A-6B provide side views of variable height wafer chucks 210/220 that may be used to reduce post-bond wafer distortion near an edge of a post-bonded wafer pair. FIGS. 7A-7B provide side views of variable height wafer chucks 230/240 that may be used to reduce post-bond wafer distortion near a center of a post-bonded wafer pair.

FIG. 6A illustrates a variable height wafer chuck 210, according to a first embodiment of the present disclosure. As shown in FIG. 6A, the variable height wafer chuck 210 comprises a mounting surface 212 for retaining a wafer. In addition, the variable height wafer chuck 210 comprises a center region 214 and a peripheral region 216 extending radially outward from an edge of the center region 214 to an outer edge of the chuck. In some embodiments, the peripheral region 216 may extend a distance (d) from the outer edge of the chuck. The distance (d) may generally be less than or equal to 50 mm when the variable height wafer chuck 210 is configured to support a 300 mm wafer. In one example, the distance (d) shown in FIG. 6A may range between about 0 mm and about 20 mm. In some embodiments, the center region 214 and the peripheral region 216 may each comprise one or more of the radial zones (Z1-Z5) shown in FIG. 5. In one example, the center region 214 may comprise a first subset of the radial zones (e.g., Z1-Z3) and the peripheral region 216 may comprise a second subset of the radial zones (e.g., Z4-Z5). It is noted, however, that the center region 214 and the peripheral region 216 are not limited to the exemplary radial zones mentioned above, and may comprise different radial zones in other embodiments.

In the embodiment shown in FIG. 6A, the mounting surface 212 of the variable height wafer chuck 210 is flat (or planar) within the center region 214 and linearly declined (or angled downward) within the peripheral region 216, so that a height of the variable height wafer chuck 210 within the peripheral region 216 is less than the height of the variable height wafer chuck 210 within the center region 214. In some embodiments, the height (h) of the variable height wafer chuck 210 may linearly decrease between the edge of the center region 214 and the edge of the peripheral region 216 (i.e., the outer edge) of the variable height wafer chuck 210, as shown in FIG. 6A. In some embodiments, the height differential (Δh), or height reduction, between the edge of the center region 214 and the edge of the peripheral region 216 (i.e., the outer edge) of the variable height wafer chuck 210 may range between −1 μm (or less) and −5 μm (or more).

FIG. 6B illustrates a variable height wafer chuck 220, according to a second embodiment of the present disclosure. Like the previous embodiment shown in FIG. 6A, the variable height wafer chuck 220 shown in FIG. 6B comprises a center region 224 and a peripheral region 226 extending a distance (d) radially outward from an edge of the center region 224 to an outer edge of the chuck. The variable height wafer chuck 220 shown in FIG. 6B differs from the variable height wafer chuck 210 shown in FIG. 6A by including a plurality of radial ribs (R1-R5), which extend vertically from an upper surface of the variable height wafer chuck 220 to provide a mounting surface 222 for a wafer. A first subset of the radial ribs (e.g., R1-R3) are included within the center region 224 and a second subset of the radial ribs (e.g., R4-R5) are included within the peripheral region 226 of the variable height wafer chuck 220.

In the embodiment shown in FIG. 6B, the mounting surface 222 of the variable height wafer chuck 220 is flat (or planar) within the center region 224 and linearly declined (or angled downward) within the peripheral region 226, so that a height of the variable height wafer chuck 220 within the peripheral region 226 is less than the height of the variable height wafer chuck 220 within the center region 224. Unlike the embodiment shown in FIG. 6A, the height differential (Δh) within the peripheral region 226 is provided in FIG. 6B by decreasing the height of the second subset of the radial ribs (e.g., radial ribs R4 and R5) located within the peripheral region 226. In some embodiments, the rib height within the peripheral region 226 may be reduced by −1 μm (or less) to −5 μm (or more) to provide a step-down height reduction, as shown in FIG. 6B. In one example embodiment, one or more of the radial ribs located within the peripheral region 226 may be reduced by approximately −3 μm.

The embodiments shown in FIGS. 6A and 6B illustrate variable height wafer chucks 210/220 that may be used to reduce post-bond wafer distortion near an edge of a post-bonded wafer pair. When a pre-bonded wafer (e.g., a lower wafer) is mounted onto a variable height wafer chuck 210/220 during a wafer bonding process, the pre-bonded wafer adheres to, and takes on the shape of, the mounting surface 212/222. In other words, the pre-bonded wafer is pre-distorted by the shape of the mounting surface 212/222 of the variable height wafer chuck 210/220.

Figure 1A:
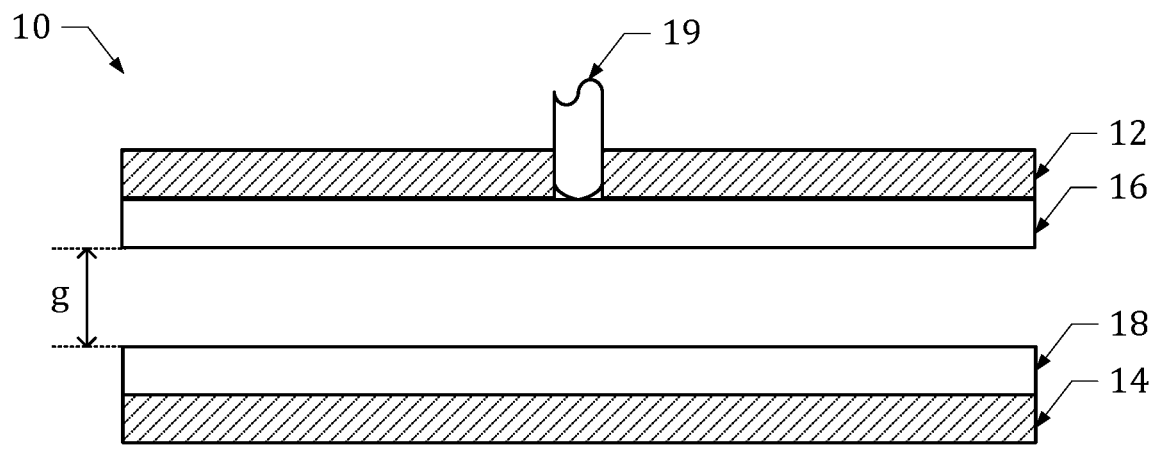
FIGS. 1A-1C (Prior Art) illustrate a conventional wafer bonding process for bonding two wafers together.
Figure 1B:
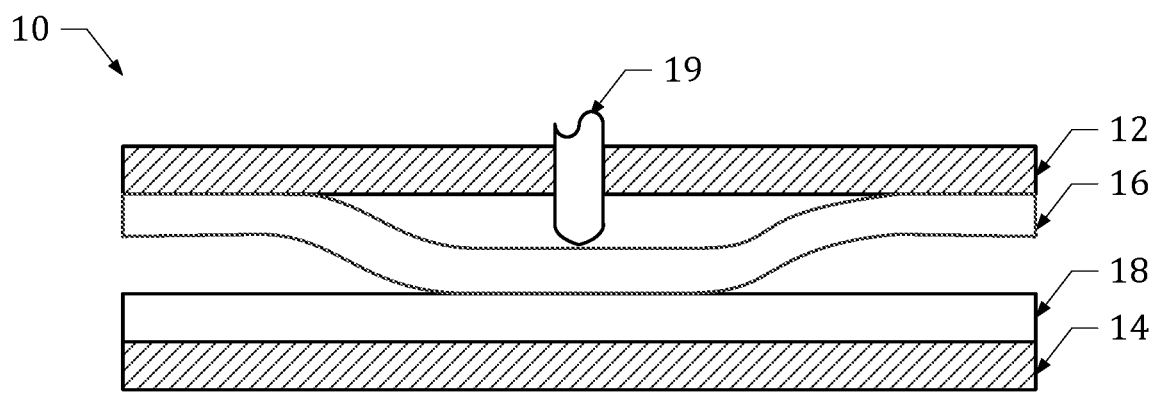
Figure 1C:
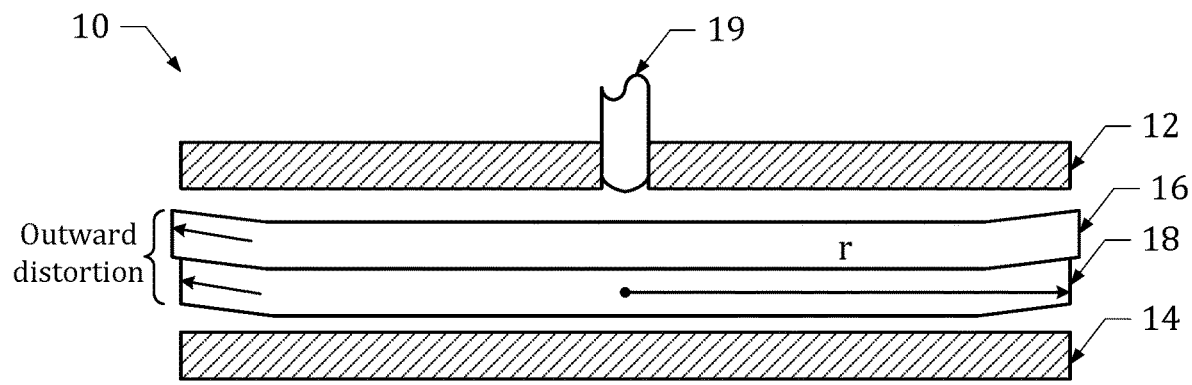
Figure 8A:
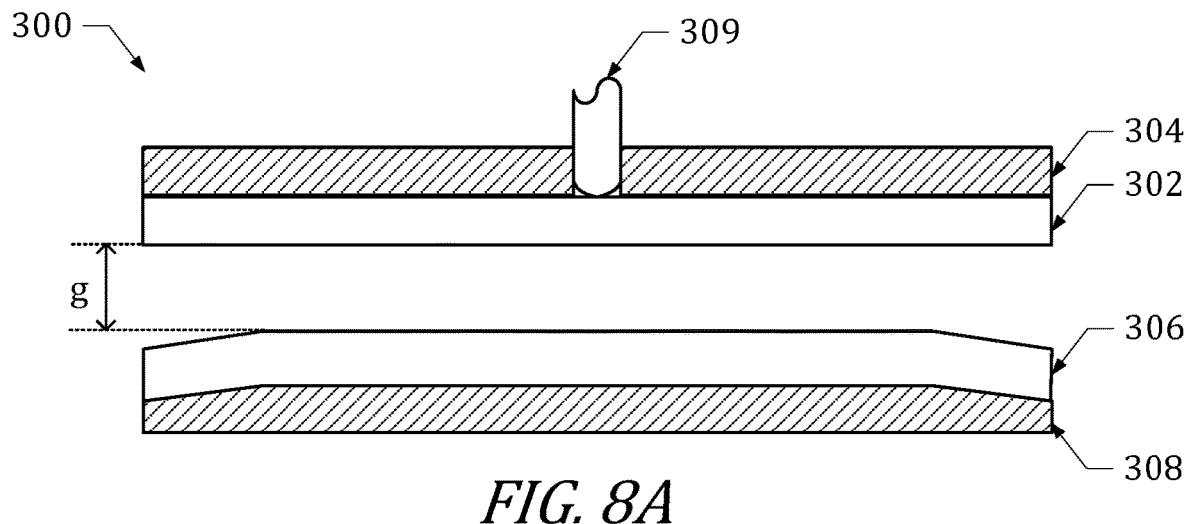
FIGS. 8A-8E illustrate an improved wafer bonding process for bonding two wafers together using the variable height wafer chuck shown in FIG. 6A or 6B.

In the embodiments shown in FIGS. 6A and 6B, the height reduction (Δh) within the peripheral region 216/226 of the variable height wafer chuck 210/220 causes peripheral portions of the pre-bonded wafer (e.g., the lower wafer) to curve or bend in a downward direction (see, e.g., FIG. 8A). This causes the bonding interface between the upper and lower wafers to stretch radially outward. As the upper wafer is bonded onto the lower wafer, the distortion along the bonding interface is "locked in" by friction that prevents any further lateral shift along the interface. When bonding is complete and the post-bonded wafer pair is released from the lower chuck (see, e.g., FIG. 8E), peripheral portions of the lower wafer may bend in an upward direction to return the post-bonded wafer pair to equilibrium. As a result, peripheral portions of the lower wafer are pushed inward along the bonded interface, thus providing an inward distortion which compensates for the outward distortion shown, e.g., in FIGS. 1C and 2. In this manner, the inward distortion produced within the peripheral portions of the lower wafer may be used to reduce lateral misalignment between the upper and lower wafers.

The variable height wafer chucks 210/220 shown in FIGS. 6A and 6B may be used in the wafer bonding apparatus 100 shown in FIGS. 3-4 and the wafer bonding process shown in FIGS. 8A-8E to reduce post-bond wafer distortion near the edge or outer periphery of the post-bonded wafer pair. In some embodiments, for example, a variable height wafer chuck 210/220 as shown in FIG. 6A or 6B may be used as the lower chuck 125 in the wafer bonding apparatus 100 and the wafer bonding process shown in FIGS. 8A-8E. However, the variable height wafer chuck 210/220 is not strictly limited to the lower chuck 125. In some embodiments, the variable height wafer chuck 210/220 shown in FIGS. 6A and 6B may be additionally used to implement the upper chuck 120 in the wafer bonding apparatus 100. In such embodiments, the upper chuck 120 may be implemented with some elastic compliance, which enables the upper chuck to elastically deform and behave like a striker to push the center of the upper wafer (W1) down to initiate bonding with the lower wafer (W2). In other embodiments, the variable height wafer chuck 210/220 shown in FIGS. 6A and 6B may be alternatively used to implement an upper chuck in an alternative wafer bonding apparatus, in which a striker is provided within a lower chuck to push the lower wafer upward to initiate bonding with the upper wafer. When used to implement the upper chuck 120, the variable height wafer chuck 210/220 shown in FIGS. 6A and 6B may provide the same effect as noted above for the lower chuck 125.

It is noted that the techniques described herein are not strictly limited to reducing post-bond wafer distortion near the edge or outer periphery of the post-bonded wafer pair. In other embodiments, a variable height wafer chuck may be configured to reduce post-bond wafer distortion within other areas, or zones, of the post-bonded wafer pair. In some cases, for example, the striker 140 used to initiate bonding between the upper wafer (W1) and lower wafer (W2) shown in FIG. 4B may create poor distortion near the center (e.g., r≤10 mm) of the post-bonded wafer pair W1/W2. To avoid this problem, FIGS. 7A-7B provide various embodiments of variable height wafer chucks 230/240 that may be used in the wafer bonding apparatus 100 shown in FIGS. 3-4 and the wafer bonding process shown in FIGS. 8A-8E to reduce post-bond wafer distortion near the center of a post-bonded wafer pair.

FIG. 7A illustrates a variable height wafer chuck 230, according to a third embodiment of the present disclosure. Like the embodiment shown in FIG. 6A, the variable height wafer chuck 230 shown in FIG. 7A comprises a mounting surface 232 for retaining a wafer, a center region 234 and a peripheral region 236 extending a distance (d) radially outward from an edge of the center region 234 to an outer edge of the chuck. In FIG. 7A, the distance (d) may generally be greater than or equal to 130 mm when the variable height wafer chuck 210 is configured to support a 300 mm wafer. In the embodiment shown in FIG. 7A, the distance (d) may range between about 135 mm and about 145 mm. In some embodiments, the center region 234 and the peripheral region 236 may each comprise one or more of the radial zones (Z1-Z5) shown in FIG. 5. In one example, the center region 234 may comprise a first subset of the radial zones (e.g., Z1-Z2) and the peripheral region 236 may comprise a second subset of the zones (e.g., Z3-Z5). It is noted, however, that the center region 234 and the peripheral region 236 are not limited to the exemplary zones mentioned above, and may comprise different radial zones in other embodiments.

In the embodiment shown in FIG. 7A, the mounting surface 232 of the variable height wafer chuck 230 is flat (or planar) within the center region 214 and linearly inclined (or angled upward) within the peripheral region 236, so that a height of the variable height wafer chuck 230 within the peripheral region 236 is greater than the height of the variable height wafer chuck 230 within the center region 234. In such embodiments, the height (h) of the variable height wafer chuck 230 may linearly increase between the edge of the center region 234 and the edge of the peripheral region 236 (i.e., the outer edge) of the variable height wafer chuck 230, as shown in FIG. 7A. In one example, a height differential (Δh), or height increase, between the edge of the center region 234 and the edge of the peripheral region 236 (i.e., the outer edge) of the variable height wafer chuck 230 may range between +1 μm (or less) and +5 μm (or more). In other embodiments (not shown), the mounting surface 232 of the variable height wafer chuck 230 may be flat (or planar) within the center region 214, linearly inclined (or angled upward) within an inner portion of the peripheral region 236 and flat (or planar) within an outer portion of the peripheral region 236. The outer portion of the peripheral region 236 may generally be smaller than the inner portion of the peripheral region 236, so that the inner portion of the peripheral region 236 provides a linearly inclined region sufficient to counteract distortion near the center of the post-bond wafer pair.

FIG. 7B illustrates a variable height wafer chuck 240, according to a fourth embodiment of the present disclosure. Like the previous embodiment shown in FIG. 7A, the variable height wafer chuck 240 shown in FIG. 7B comprises a center region 244 and a peripheral region 246 extending a distance (d) radially outward from an edge of the center region 244 to an outer edge of the chuck. The variable height wafer chuck 240 shown in FIG. 7B differs from the variable height wafer chuck 230 shown in FIG. 7A by including a plurality of radial ribs (R1-R5), which extend vertically from an upper surface of the variable height wafer chuck 240 to provide a mounting surface 242 for a wafer. A first subset of the radial ribs (e.g., R1-R2) are included within the center region 244 and a second subset of the radial ribs (e.g., R3-R5) are included within the peripheral region 246 of the variable height wafer chuck 240.

In the embodiment shown in FIG. 7B, the mounting surface 242 of the variable height wafer chuck 240 is flat (or planar) within the center region 244 and linearly inclined (or angled upward) within the peripheral region 246, so that a height of the variable height wafer chuck 240 within the peripheral region 246 is greater than the height of the variable height wafer chuck 240 within the center region 244. Unlike the embodiment shown in FIG. 7A, the height differential (Δh) within the peripheral region 246 is provided in FIG. 7B by increasing the height of the second subset of the radial ribs (e.g., ribs R3, R4 and R5) located within the peripheral region 236. In some embodiments, the rib height within the peripheral region 246 may be increased by +1 μm (or less) to +5 μm (or more) to provide a step-up height increase, as shown in FIG. 7B. Alternatively, the rib height within the peripheral region 246 may remain unchanged, and the rib height within the center region 244 may be decreased by −1 μm (or less) to −5 μm (or more) to provide the desired height differential (Δh). In yet another alternative embodiment, the height of one or more of the radial ribs (e.g., ribs R3 and R4) located within an inner portion of the peripheral region 236 may be increased by +1 μm (or less) to +5 μm (or more) to provide a step-up height increase within the inner portion of the peripheral region 236, while the height of one or more radial ribs (e.g., rib R5) located within an outer portion of the peripheral region 236 remains unchanged or equal to the rib height within the center region 244.

The embodiments shown in FIGS. 7A and 7B illustrate variable height wafer chucks 230/240 that may be used to reduce post-bond wafer distortion near a center of a post-bonded wafer pair. When a pre-bonded wafer (e.g., a lower wafer) is mounted onto a variable height wafer chuck 230/240 during a wafer bonding process, the pre-bonded wafer adheres to, and takes on the shape of, the mounting surface 232/242. In other words, the pre-bonded wafer is pre-distorted by the shape of the mounting surface 232/242 of the variable height wafer chuck 230/240.

In the embodiments shown in FIGS. 7A and 7B, the height increase (Δh) within the peripheral region 236/246 (or alternatively, the height decrease within the center region 234/244) of the variable height wafer chuck 230/240 causes peripheral portions of the pre-bonded wafer (e.g., the lower wafer) to curve or bend in an upward direction. This causes the bonding interface on the pre-bonded wafer to distort radially inward. As the upper wafer is bonded onto the lower wafer, the distortion along the bonding interface is "locked in" by friction that prevents any further lateral shift along the interface. When bonding is complete and the post-bonded wafer pair is released from the lower chuck, peripheral portions of the lower wafer may bend in a downward direction to return the post-bonded wafer pair to equilibrium. This enables peripheral portions of the lower wafer to be pushed outward along the bonded interface, thus providing an outward distortion which compensates for inward distortion created in the pre-bonded wafer. In this manner, the outward distortion produced within the peripheral portions of the lower wafer may be used to reduce the lateral misalignment between the upper and lower wafers, which is created by the striker 140.

The variable height wafer chucks 230/240 shown in FIGS. 7A and 7B may be used in the wafer bonding apparatus 100 shown in FIGS. 3-4 and the wafer bonding process shown in FIGS. 8A-8E to reduce post-bond wafer distortion near the center of the post-bonded wafer pair. In some embodiments, for example, a variable height wafer chuck 230/240 as shown in FIG. 7A or 7B may be used as the lower chuck 125 in the wafer bonding apparatus 100 to reduce post-bond wafer distortion near the center of a post-bonded wafer pair. However, the variable height wafer chuck 230/240 is not strictly limited to the lower chuck 125. In some embodiments, the variable height wafer chuck 230/240 shown in FIGS. 7A and 7B may be additionally used to implement the upper chuck 120 in the wafer bonding apparatus 100. In such embodiments, the upper chuck 120 may be implemented with some elastic compliance, which enables the upper chuck to elastically deform and behave like a striker to push the center of the upper wafer (W1) down to initiate bonding with the lower wafer (W2). In other embodiments, the variable height wafer chuck 230/240 shown in FIGS. 7A and 7B may be alternatively used to implement an upper chuck in an alternative wafer bonding apparatus, in which a striker is provided within a lower chuck to push the lower wafer upward to initiate bonding with the upper wafer. When used to implement the upper chuck 120, the variable height wafer chuck 230/240 shown in FIGS. 7A and 7B may provide the same effect as noted above for the lower chuck 125.

In some embodiments, one or more of the embodiments shown in FIGS. 6-7 may be combined to reduce post-bond wafer distortion near the edge and near the center of a post-bonded wafer pair. It is noted that the embodiments of variable height wafer chucks shown in FIGS. 6-7 are exemplary, and that the techniques described herein may be used to reduce post-bond wafer distortion within other areas, or zones, of a post-bonded wafer pair. It is further noted that the height differential (Δh) and the distance (d) described herein are exemplary. Particular values of Δh and d may generally be selected based on physical modeling of a particular wafer bonding process and the pre-bonded wafer shapes of the upper and lower wafers. For example, the height differential (Δh) and/or the distance (d) may be derived an optimized empirically from experimental measurements of post-bonded wafers.

An improved wafer bonding process is shown in FIGS. 8A-8E for bonding two wafers together (e.g., an upper wafer and a lower wafer) using the variable height wafer chuck 210/220 shown in FIG. 6A or FIG. 6B. In the illustrated embodiment, a variable height wafer chuck is used to implement the lower chuck. In other embodiments, a variable height wafer chuck may be used to implement the upper chuck, or the lower chuck and the upper chuck. Although the wafer bonding process shown in FIGS. 8A-8E uses a variable height wafer chuck configured to reduce post-bond wafer distortion near the edge of a post-bonded wafer pair, one skilled in the art would understand how the illustrated process could utilize other variable heigh wafer chucks to reduce post-bond wafer distortion within other areas, or zones, of a post-bonded wafer pair. For example, the variable height wafer chuck 230/240 shown in FIG. 7A or 7B may be used within a similar wafer bonding process to reduce post-bond wafer distortion near the center of a post-bonded wafer pair.

In some embodiments, the improved wafer bonding process may begin in step 300 of FIG. 8A upon receiving an upper wafer 302 on a mounting surface of an upper chuck 304 and a lower wafer 306 on a mounting surface of a lower chuck 308. When the upper chuck 304 and lower chuck 308 are implemented as vacuum chucks, the upper wafer 302 and the lower wafer 306 may be retained on their respective chucks by a vacuum pressure provided, e.g., by a vacuum pump. The upper and lower wafers may be initially separated by a small gap (g), as shown in FIG. 8A.

Figure 8B:
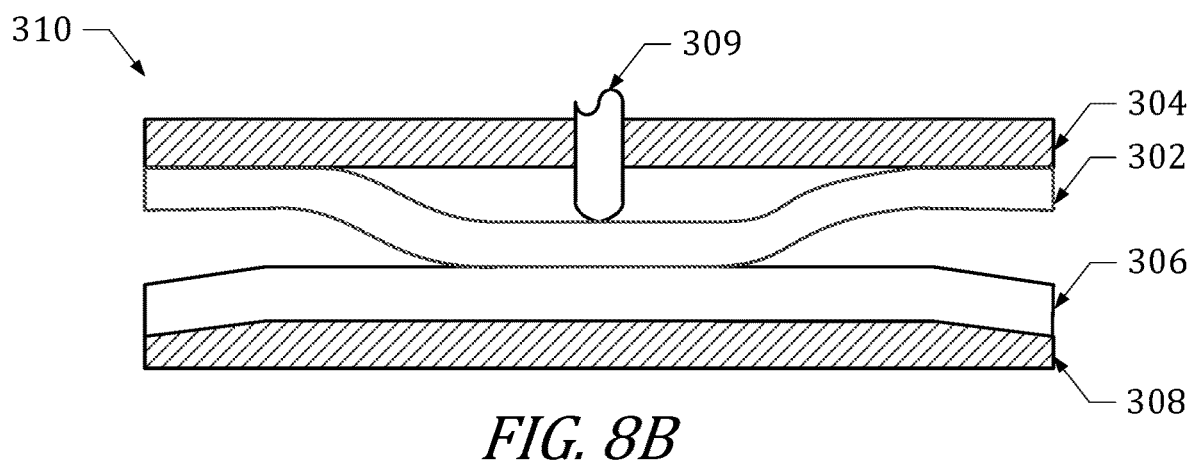

As shown in FIG. 8B, a striker 309 may be used to apply a mechanical force to the center of the upper wafer 302 to initiate bonding in step 310. The mechanical force provided by the striker 309 causes the center of the upper wafer 302 to bow or bend in a downward direction until the center of the upper wafer 302 makes contact with the center of the lower wafer 306. This contact initiates a bonding front that spontaneously propagates radially outward from the center of the upper and lower wafers. As the contact surface area increases, the upper and lower wafers elastically deform in order to close the initial gap (g) between the two wafers.

Figure 8C:
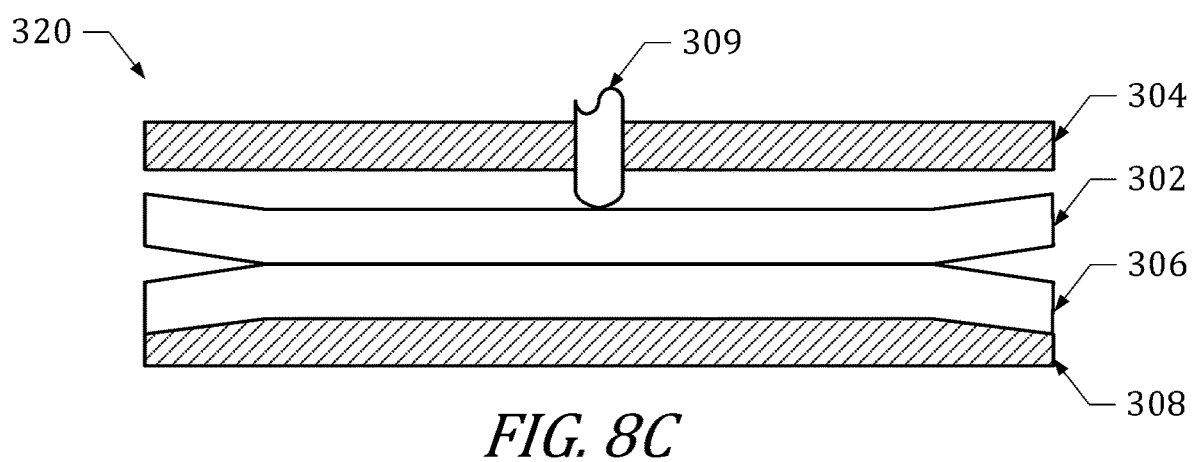
Figure 8D:
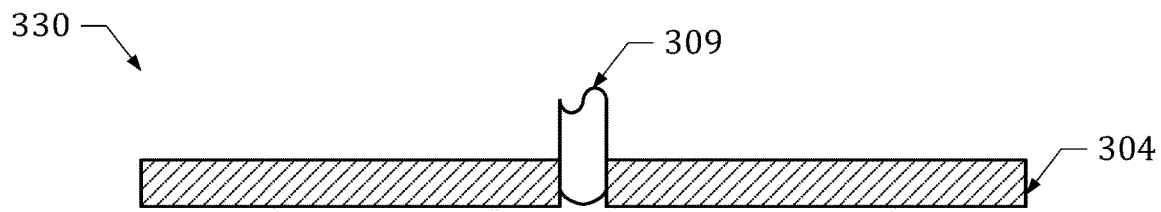
Figure 8E:
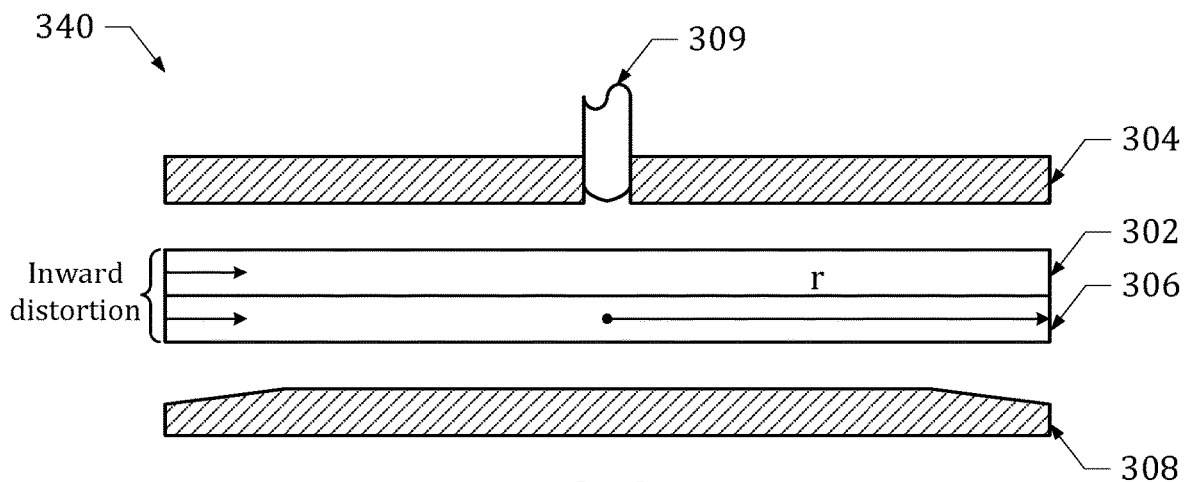

As shown in FIG. 8C, the vacuum pressure to the upper chuck 304 may be turned off in step 320 before the bonding between the upper and lower wafers is complete. When the contact surface area is large enough, the vacuum seal between the upper chuck 304 and the upper wafer 302 breaks, and the bonding front continues to propagate outwards until the two wafers are fully bonded, as shown in FIG. 8D. Once the bond between the upper and lower wafers is complete, the striker 309 is retracted in step 330 of FIG. 8D, and the vacuum pressure to the lower chuck 308 is turned off in step 340 of FIG. 8E to release the post-bonded wafer pair 302/306 from the lower chuck 308.

In an alternative wafer bonding process (not shown), the striker 309 may be retracted and the vacuum pressure to the lower chuck 308 may be turned off before the vacuum pressure to the upper chuck 304 is turned off in FIG. 8C. In such a process, bonding forces between the upper wafer 302 and the lower wafer 306 may cause the vacuum seal between the lower wafer 306 and the lower chuck 308 to break before bonding completes and/or before vacuum pressure to the upper chuck 304 is turned off. When this occurs, the bonding forces between the upper wafer 302 and the lower wafer 306 may work against gravitational forces to bond the lower wafer 306 onto the upper wafer 302 retained on the upper chuck 304. Once bonding is complete, the vacuum pressure to the upper chuck 304 is turned off to release the post-bonded wafer pair 302/306 from the upper chuck 304.

The improved wafer bonding process shown in FIGS. 8A-8E reduces post-bond wafer distortion near the edge of the post-bonded wafer pair 302/306 by utilizing a variable height wafer chuck, which pre-distorts at least one of the pre-bonded wafers (e.g., the lower wafer) by bending peripheral portions of the pre-bonded wafer in a downward direction (see, e.g., FIG. 8A). This pre-distortion causes the bonding interface between the upper and lower wafers to stretch or distort radially outward. As the upper wafer 302 is bonded onto the lower wafer 306, the distortion along the bonding interface is "locked in" by friction that prevents any further lateral shift along the interface. When bonding is complete (see, e.g., FIG. 8D) and the vacuum pressure to the lower chuck 308 is turned off to release the post-bonded wafer pair from the lower chuck 308 (see, e.g., FIG. 8E), peripheral portions of the lower wafer 306 may bend in an upward direction to return the post-bonded wafer pair 302/306 to equilibrium. As a result, peripheral portions of the lower wafer 306 are pushed inward along the bonded interface, thus providing an inward distortion which compensates for the outward distortion shown, e.g., in FIGS. 1C and 2.

Figure 9:
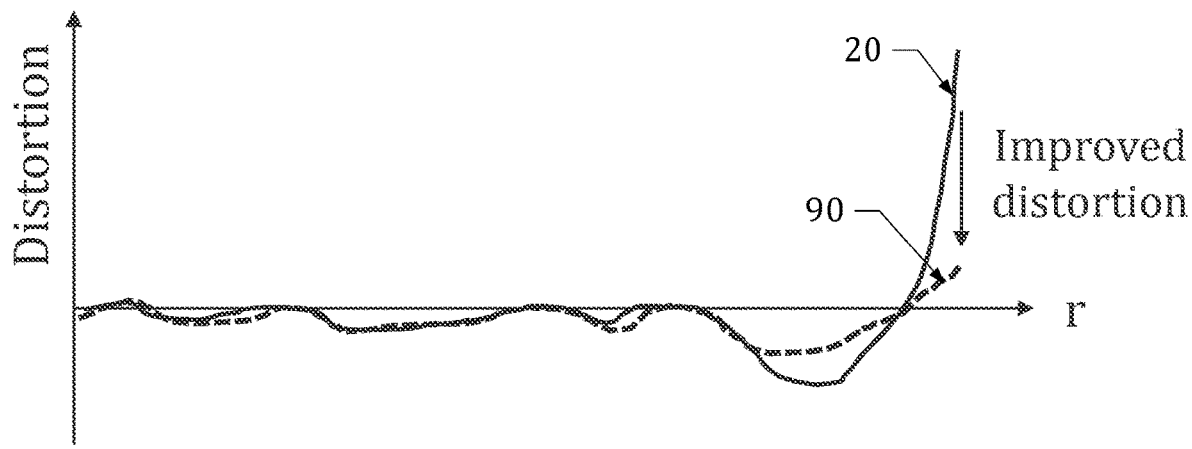
FIG. 9 is a graph illustrating distortion of a post-bonded wafer pair as a function of radius (r) when the improved wafer bonding process shown in FIGS. 8A-8E is used to bond two wafers together.

FIG. 9 is a graph illustrating distortion of a post-bonded wafer pair as a function of radius (r) when the improved wafer bonding process shown in FIGS. 8A-8E is used to bond two wafers together. As shown in FIG. 9, the improved wafer bonding process shown in FIGS. 8A-8E creates much less distortion 90 near the edge of the post-bonded wafer pair, than the distortion 20 created by conventional wafer bonding processes. Reducing the distortion 90 near the edge of the post-bonded wafer pair reduces the post-bond distortion error attributed to the wafer bonding process and minimizes the lateral shift (or lateral misalignment) between the two wafers.

The improved wafer bonding process shown in FIGS. 8A-8E and the variable height wafer chuck 210/220 shown in FIGS. 6A and 6B are particularly well suited for reducing distortion 90 at the edge of the post-bonded wafer pair because the distortion performance at the edge is very similar for all wafers. In conventional wafer bonding processes, the distortion 20 at the bonded interface is generally higher (i.e., a positive, outward displacement) at the edge, than the center of the of the post-bonded wafer pair with a sharp slope towards the edge. This distinct characteristic can be corrected by using a variable height wafer chuck as shown in FIG. 6A or 6B. Conversely, if a post-bonded wafer pair displays an opposite distortion behavior, where the distortion is lower at the edge (i.e., a negative, inward displacement) and higher at the center, a wafer bonding process using a variable height wafer chuck as shown in FIG. 7A or 7B could be used to reduce post-bond wafer distortion at the center.

The embodiments shown in FIGS. 6-8 reduce post-bond wafer distortion by modifying the surface height of at least one of the wafer chucks. Other hardware modifications may also be used to reduce post-bond wafer distortion. For example, a ring of temperature regulating element(s) can be placed within one or more areas, or zones, of a wafer chuck to improve distortion within those areas or zones. In one example implementation, a ring of Peltier chip can be embedded within the lower chuck and/or the upper chuck to regulate the temperature on the chuck surface. Prior to the bonding process, the temperature regulating element(s) may be activated to transfer heat to (or from) a region of the wafer overlying and/or adjacent to the temperature regulating element(s). This heat transfer results in a local change in temperature at the region of the wafer, which causes the region to expand or contract laterally. This produces a lateral displacement mismatch between the wafer pair that becomes permanent after the bonding step.

Figure 10:
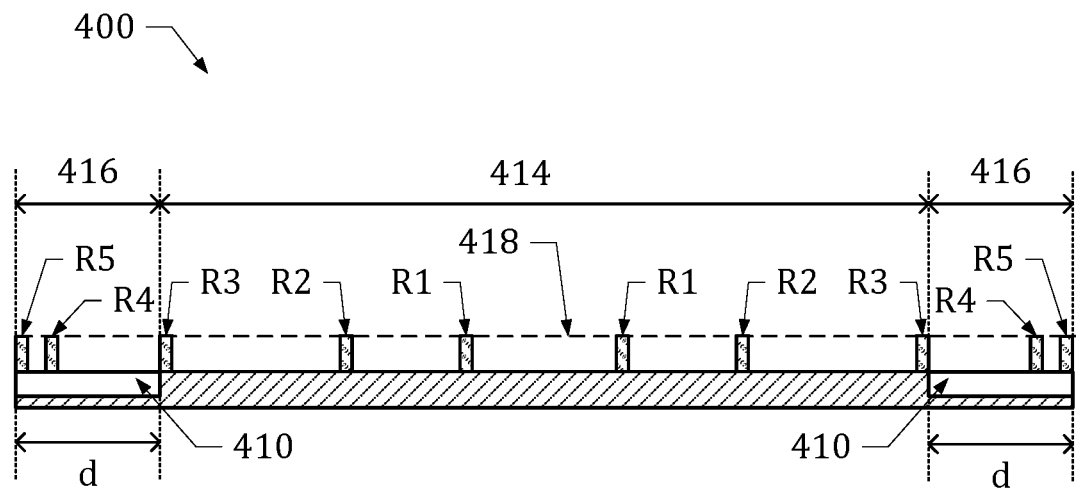
FIG. 10 is a side view of a wafer chuck having temperature regulation means within one or more zones of the wafer chuck, according to a fifth embodiment of the present disclosure.

FIG. 10 is a side view of a wafer chuck 400, according to a fifth embodiment of the present disclosure. The wafer chuck 400 shown in FIG. 10 comprise one or more temperature regulation elements 410 embedded within one or more areas, or zones, of the wafer chuck. As such, the wafer chuck 400 shown in FIG. 10 may otherwise be referred to herein as a "temperature regulating wafer chuck."

The temperature regulating wafer chuck 400 shown in FIG. 10 comprises a center region 414 and a peripheral region 416 extending radially outward from an edge of the center region 414 to an outer edge of the chuck. In some embodiments, the peripheral region 416 may extend a distance (d) from the outer edge of the chuck. The distance (d) may generally be less than or equal to 50 mm when the temperature regulating wafer chuck 400 is configured to support a 300 mm wafer. In one example, the distance (d) shown in FIG. 10 may range between about 5 mm and about 10 mm. In some embodiments, the center region 414 and the peripheral region 416 may each comprise one or more of the radial zones (Z1-Z5) shown in FIG. 5. In one example, the center region 414 may comprise a first subset of the radial zones (e.g., Z1-Z3) and the peripheral region 416 may comprise a second subset of the radial zones (e.g., Z4-Z5). It is noted, however, that the center region 414 and the peripheral region 416 are not limited to the exemplary zones mentioned above, and may comprise different radial zones in other embodiments.

The temperature regulating wafer chuck 400 shown in FIG. 10 further comprises a plurality of radial ribs (R1-R5), which extend vertically from an upper surface of the temperature regulating wafer chuck 400 to provide a mounting surface 418 for a wafer. Alternatively, the ribs shown in FIG. 10 may be omitted, and a wafer may be mounted directly on an upper surface of the temperature regulating wafer chuck 400. In the embodiment shown in FIG. 10, the mounting surface 418 of the temperature regulating wafer chuck 400 is flat across the entire wafer chuck (i.e., across the center region 414 and the peripheral region 416. Alternatively, the mounting surface of the temperature regulating chuck may be flat within the center region 414, and declined within the peripheral region 416 (as shown in FIGS. 6A-6B) or inclined within the peripheral region 416 (as shown in FIGS. 7A-7B) as described above.

The temperature regulating wafer chuck 400 shown in FIG. 10 further comprises one or more temperature regulation elements 410 embedded within one or more areas, or zones, of the wafer chuck. In the embodiment shown in FIG. 10, the temperature regulating element(s) 410 is/are embedded within the peripheral region 416 of the temperature regulating wafer chuck 400 to transfer heat to (or from) the edge of a wafer mounted to the mounting surface 418 (or the upper surface) of the temperature regulating wafer chuck 400. It is noted, however, that the temperature regulating element(s) 410 is/are not limited to the exemplary placement shown in FIG. 10, and may be additionally or alternatively arranged within other areas, or zones, of the temperature regulating wafer chuck 400 to transfer heat to (or from) other areas of the wafer. In one embodiment, the temperature regulating element(s) 410 may be Peltier element(s).

Figure 11:
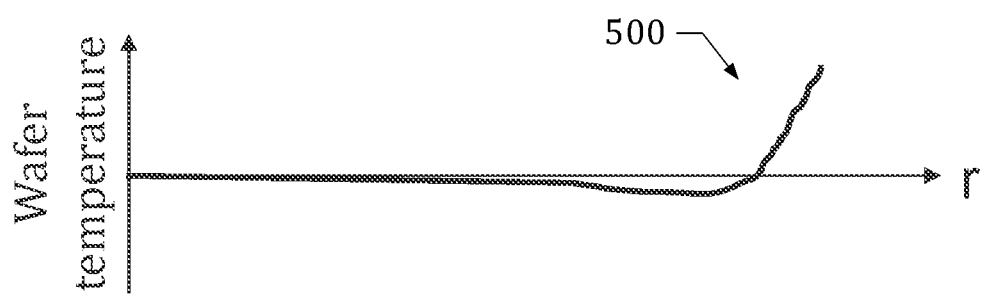
FIG. 11 is a graph illustrating wafer temperature as a function of radius (r) when the wafer chuck shown in FIG. 10 is used in the wafer bonding process shown in FIGS. 8A-8E to bond two wafers together.

FIG. 11 is a graph illustrating wafer temperature as a function of radius (r) when the temperature regulating wafer chuck 400 shown in FIG. 10 is used in the wafer bonding process shown in FIGS. 8A-8E to bond two wafers together. As shown in FIG. 11, the temperature regulating element(s) 410 embedded within the peripheral region 416 of the temperature regulating wafer chuck 400 may be activated prior to the bonding process to heat the wafer chuck, so that heat may be transferred to the wafer during the bonding process. Transferring heat to the wafer edge causes the wafer temperature 500 to increase near the edge of the wafer, as shown in FIG. 11, and causes the region near the wafer edge to laterally expand. The lateral expansion of the wafer edge creates an outward distortion, which produces a lateral displacement mismatch between the upper and lower wafers that becomes permanent after the bonding step. In some embodiments, the temperature regulating element(s) 410 may provide approximately 5 nm of outward distortion at the wafer edge for each 0.1° C. increase in wafer temperature.

In other embodiments, the temperature regulating element(s) 410 may alternatively be used to cool, or extract heat from, one or more regions or zones of the wafer. Cooling a region causes the region to laterally contract and create an inward distortion, which produces a lateral displacement mismatch between the upper and lower wafers. In some embodiments, the temperature regulating element(s) 410 may provide approximately 5 nm of inward distortion at the wafer edge for each 0.1° C. decrease in wafer temperature.

In some embodiments, the temperature regulating wafer chuck 400 shown in FIG. 10 may be used in the wafer bonding apparatus 100 shown in FIGS. 3-4 and the wafer bonding process shown in FIGS. 8A-8E to reduce post-bond wafer distortion within one or more areas, or zones, of the post-bonded wafer pair. The temperature regulating wafer chuck 400 allows for flexibility in tuning the distortion based on the incoming wafer metrology. The amount and direction of distortion can be adjusted by adjusting the temperature of the temperature regulating element(s) 410 relative to the rest of the wafer. In some embodiments, the temperature regulating elements 410 shown in FIG. 10 may be included within one of the variable height chuck designs shown in FIGS. 6-7.

Figure 12:
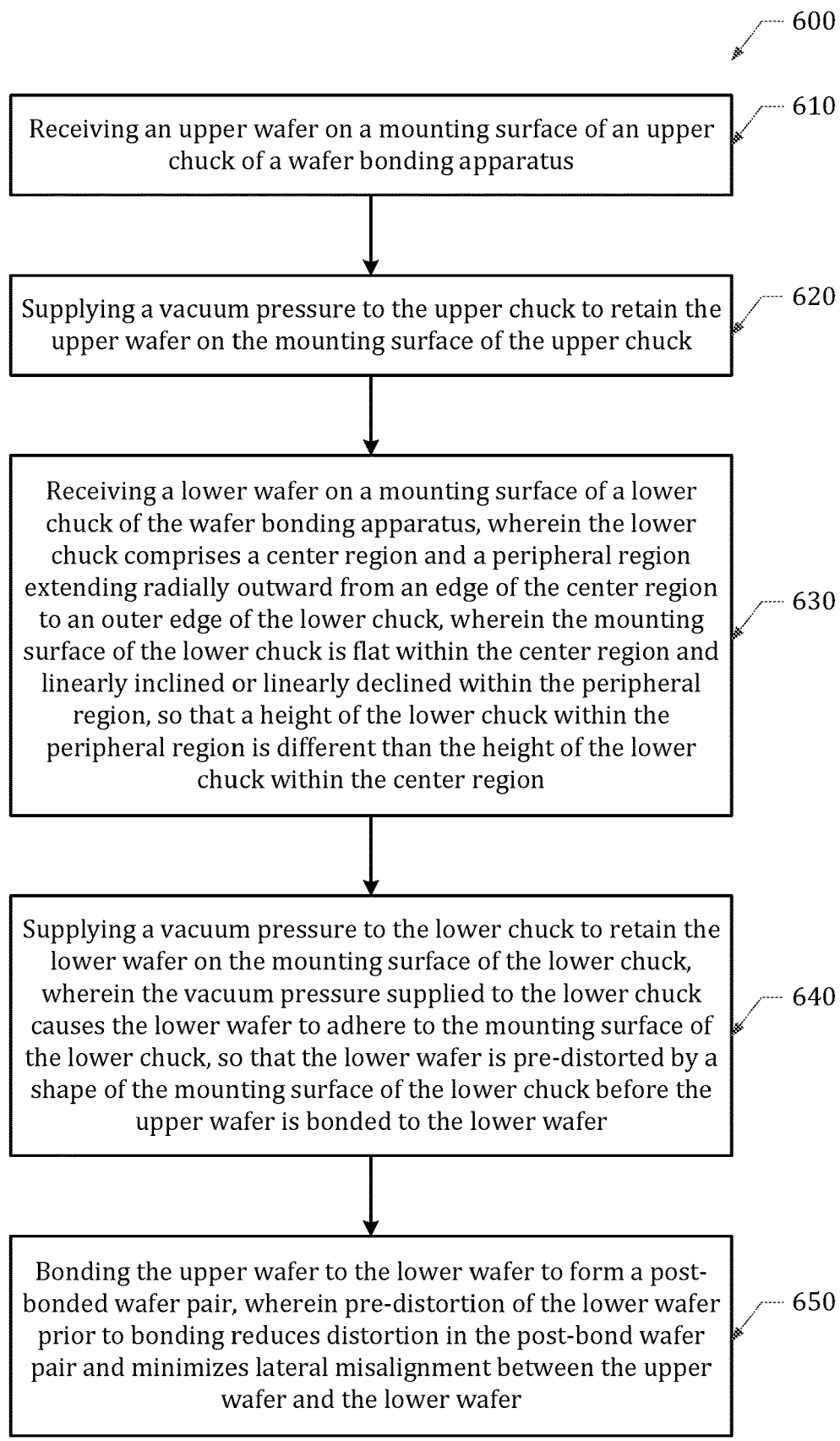
FIG. 12 is a flowchart diagram illustrating one embodiment of a method to reduce distortion in a post-bonded wafer pair.

FIG. 12 is a flowchart diagram illustrating one embodiment of a method 600 to reduce distortion in a post-bonded wafer pair. In general, the method 600 may include receiving an upper wafer on a mounting surface of an upper chuck of a wafer bonding apparatus (in step 610) and supplying a vacuum pressure to the upper chuck to retain the upper wafer on the mounting surface of the upper chuck (in step 620). The method 600 may further include receiving a lower wafer on a mounting surface of a lower chuck of the wafer bonding apparatus (in step 630) and supplying a vacuum pressure to the lower chuck to retain the lower wafer on the mounting surface of the lower chuck (in step 640). The method 600 may further include bonding the upper wafer to the lower wafer to form a post-bonded wafer pair (in step 650).

In some embodiments of the method 600 described herein, the lower chuck comprises a center region and a peripheral region extending radially outward from an edge of the center region to an outer edge of the lower chuck. The mounting surface of the lower chuck is flat within the center region and linearly inclined or linearly declined within the peripheral region, so that a height of the lower chuck within the peripheral region is different than the height of the lower chuck within the center region. When vacuum pressure is supplied to the lower chuck (in step 640), the vacuum pressure supplied to the lower chuck causes the lower wafer to adhere to the mounting surface of the lower chuck, so that the lower wafer is pre-distorted by a shape of the mounting surface of the lower chuck before the upper wafer is bonded to the lower wafer (in step 650). The pre-distortion of the lower wafer prior to bonding advantageously reduces distortion in the post-bond wafer pair and minimizes lateral misalignment between the upper wafer and the lower wafer.

In some embodiments of the method 600 described herein, the upper chuck comprises a center region and a peripheral region extending radially outward from an edge of the center region to an outer edge of the upper chuck. The mounting surface of the upper chuck is flat within the center region and linearly inclined or linearly declined within the peripheral region, so that a height of the upper chuck within the peripheral region is different than the height of the upper chuck within the center region. When vacuum pressure is supplied to the upper chuck (in step 640), the vacuum pressure supplied to the upper chuck causes the upper wafer to adhere to the mounting surface of the upper chuck, so that the upper wafer is pre-distorted by a shape of the mounting surface of the upper chuck before the lower wafer is bonded to the upper wafer (in step 650). The pre-distortion of the upper wafer prior to bonding advantageously reduces distortion in the post-bond wafer pair and minimizes lateral misalignment between the upper wafer and the lower wafer.

In some embodiments, the bonding step (i.e., step 650) may include applying a mechanical force to a center of the upper wafer to initiate bonding between the upper wafer and the lower wafer, removing the vacuum pressure supplied to the upper chuck before the bonding between the upper wafer and the lower wafer is complete, and removing the vacuum pressure supplied to the lower chuck after the bonding between the upper wafer and the lower wafer completes to form the post-bonded wafer pair. In such embodiments, the post-bonded wafer pair may remain on the lower chuck until the vacuum pressure supplied to the lower chuck is removed.

In other embodiments, the bonding step (i.e., step 650) may include applying a mechanical force to a center of the upper wafer to initiate bonding between the upper wafer and the lower wafer, removing the vacuum pressure supplied to the lower chuck before the bonding between the upper wafer and the lower wafer is complete, and removing the vacuum pressure supplied to the upper chuck after the bonding between the upper wafer and the lower wafer completes to form the post-bonded wafer pair. In such embodiments, bonding forces between the upper wafer and the lower wafer may cause a vacuum seal between the lower wafer and the lower chuck to break before the vacuum pressure supplied to the lower chuck is removed. When this occurs, the bonding forces between the upper wafer and the lower wafer may work against gravitational forces to bond the lower wafer onto the upper wafer, while the upper wafer is retained on the upper chuck. In such embodiments, the post-bonded wafer pair may remain on the upper chuck until the vacuum pressure supplied to the upper chuck is removed.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a substrate are described in various embodiments. The substrate may include any material portion or structure of a device, particularly a semiconductor or other electronics device, and may, for example, be a base substrate structure, such as a semiconductor substrate or a layer on or overlying a base substrate structure such as a thin film. Thus, the term "substrate" is not intended to be limited to any particular base structure, underlying layer or overlying layer, patterned or unpatterned, but rather, is contemplated to include any such layer or base structure, and any combination of layers and/or base structures. In some cases, the term "substrate" may be used to describe a patterned or unpatterned wafer, such as a device wafer or a carrier wafer.

One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A wafer bonding apparatus, comprising:
a first chuck comprising a first mounting surface configured to retain a first wafer; and
a second chuck comprising a second mounting surface configured to retain a second wafer, wherein the second chuck further comprises a center region, a peripheral region extending radially outward from an edge of the center region to an outer edge of the second chuck, and a plurality of radial ribs that extend vertically from a planar upper surface of the second chuck to provide the second mounting surface;
wherein the second mounting surface is flat within the center region and linearly inclined or linearly declined within the peripheral region, so that a height of the second chuck within the peripheral region is different than the height of the second chuck within the center region.

2. The wafer bonding apparatus of claim 1, wherein the second mounting surface is linearly declined within the peripheral region, and wherein the height of the second chuck within the peripheral region is less than the height of the second chuck within the center region.

3. The wafer bonding apparatus of claim 2, wherein a height differential between the edge of the center region and the outer edge of the second chuck is selected from a range including −1 µm to −5 µm.

4. The wafer bonding apparatus of claim 3, wherein the plurality of radial ribs include a first subset of radial ribs located within the center region and a second subset of radial ribs located within the peripheral region, and wherein the height differential is provided by configuring the plurality of radial ribs, such that a height of the second subset of radial ribs is less than a height of the first subset of radial ribs.

5. The wafer bonding apparatus of claim 1, wherein the second mounting surface is linearly inclined within the peripheral region, and wherein the height of the second chuck within the peripheral region is greater than the height of the second chuck within the center region.

6. The wafer bonding apparatus of claim 5, wherein a height differential between the edge of the center region and the outer edge of the second chuck is selected from a range including +1 μm to +5 μm.

7. The wafer bonding apparatus of claim 6, wherein the plurality of radial ribs include a first subset of radial ribs located within the center region and a second subset of radial ribs located within the peripheral region, and wherein the height differential is provided by configuring the plurality of radial ribs, such that a height of the second subset of radial ribs is greater than a height of the first subset of radial ribs.

8. A wafer bonding apparatus, comprising:
 a first chuck comprising a first mounting surface configured to retain a first wafer; and
 a second chuck comprising a second mounting surface configured to retain a second wafer, wherein the second chuck further comprises:
  a planar upper surface comprising a plurality of radial zones extending radially outward from a center of the second chuck to an outer edge of the second chuck, wherein a first subset of the plurality of radial zones is located within a center region of the second chuck, and wherein a second subset of the plurality of radial zones is located within a peripheral region of the second chuck that extends radially outward from an edge of the center region to an outer edge of the second chuck; and
  a plurality of radial ribs, each located at a boundary between two of the radial zones and extending vertically from the planar upper surface of the second chuck to provide the second mounting surface, wherein:
   a first subset of the plurality of radial ribs is located within the first subset of the plurality of radial zones;
   a second subset of the plurality of radial ribs is located within the second subset of the plurality of radial zones; and
   wherein a height of the second subset of the plurality of radial ribs differs from a height of the first subset of the plurality of radial ribs.

9. The wafer bonding apparatus of claim 8, wherein the second mounting surface is flat or planar across the first subset of the plurality of radial ribs, and wherein the second mounting surface is linearly declined or linearly inclined across the second subset of the plurality of radial ribs.

10. The wafer bonding apparatus of claim 9, wherein the second mounting surface is linearly declined or angled downward across the second subset of the plurality of radial ribs, so that the height of the second chuck at the outer edge of the second chuck is less than the height of the second chuck within the center region.

11. The wafer bonding apparatus of claim 10, wherein a height decrease within the peripheral region of the second chuck causes peripheral portions of the second wafer to bend in a downward direction prior to bonding, and wherein when bonding between the first wafer and the second wafer is complete, the peripheral portions of the second wafer bend in an upward direction to provide an inward distortion, which reduces lateral misalignment between the first wafer and the second wafer.

12. The wafer bonding apparatus of claim 9, wherein the second mounting surface is linearly inclined or angled upward across the second subset of the plurality of radial ribs, so that the height of the second chuck at the outer edge of the second chuck is greater than the height of the second chuck within the center region.

13. The wafer bonding apparatus of claim 12, wherein a height increase within the peripheral region of the second chuck causes peripheral portions of the second wafer to bend in an upward direction prior to bonding, and wherein when bonding between the first wafer and the second wafer is complete, the peripheral portions of the second wafer bend in a downward direction to provide an outward distortion, which reduces lateral misalignment between the first wafer and the second wafer.

14. The wafer bonding apparatus of claim 8, wherein at least one of the first chuck and the second chuck comprises one or more temperature regulation elements embedded within one or more radial zones of the plurality of radial zones.

15. The wafer bonding apparatus of claim 14, wherein the one or more temperature regulation elements are configured to transfer heat to a region of the first wafer and/or the second wafer overlying the one or more radial zones, which causes the region of the first wafer and/or the second wafer to laterally expand and create an outward distortion that reduces lateral misalignment between the first wafer and the second wafer.

16. The wafer bonding apparatus of claim 14, wherein the one or more temperature regulation elements are configured to transfer heat from a region of the first wafer and/or the second wafer overlying the one or more radial zones, which causes the region of the first wafer and/or the second wafer to laterally contract and create an inward distortion that reduces lateral misalignment between the first wafer and the second wafer.

17. A method, comprising:
 receiving an upper wafer on a mounting surface of an upper chuck of a wafer bonding apparatus;
 supplying a vacuum pressure to the upper chuck to retain the upper wafer on the mounting surface of the upper chuck;
 receiving a lower wafer on a mounting surface of a lower chuck of the wafer bonding apparatus, wherein the lower chuck comprises a planar upper surface, a center region, a peripheral region extending radially outward from an edge of the center region to an outer edge of the lower chuck, and a plurality of radial ribs that extend vertically from the planar upper surface of the lower chuck to provide the mounting surface of the lower chuck, wherein the plurality of radial ribs includes a first subset of radial ribs located within the center region and a second subset of radial ribs located within the peripheral region, and wherein the mounting surface of the lower chuck is flat within the center region and linearly inclined or linearly declined within the peripheral region by configuring the plurality of radial ribs, so that a height of the second subset of radial ribs within the peripheral region is different than a height of the first set of radial ribs within the center region;
 supplying a vacuum pressure to the lower chuck to retain the lower wafer on the mounting surface of the lower chuck, wherein the vacuum pressure supplied to the lower chuck causes the lower wafer to adhere to the mounting surface of the lower chuck, so that the lower wafer is pre-distorted by a shape of the mounting surface of the lower chuck before the upper wafer is bonded to the lower wafer; and bonding the upper wafer to the lower wafer to form a post-bonded wafer pair, wherein pre-distortion of the lower wafer prior to bonding reduces distortion in the post-bond wafer pair and minimizes lateral misalignment between the upper wafer and the lower wafer.

18. The method of claim 17, wherein said bonding comprises:
- applying a mechanical force to a center of the upper wafer to initiate bonding between the upper wafer and the lower wafer;
- removing the vacuum pressure supplied to the upper chuck after initiating the bonding, but before the bonding between the upper wafer and the lower wafer is complete; and
- removing the vacuum pressure supplied to the lower chuck after the bonding between the upper wafer and the lower wafer completes to form the post-bonded wafer pair, wherein the post-bonded wafer pair remains on the lower chuck until the vacuum pressure supplied to the lower chuck is removed.

19. The method of claim 17, wherein said bonding comprises:
- applying a mechanical force to a center of the upper wafer to initiate bonding between the upper wafer and the lower wafer;
- removing the vacuum pressure supplied to the lower chuck after initiating the bonding, but before the bonding between the upper wafer and the lower wafer is complete; and
- removing the vacuum pressure supplied to the upper chuck after the bonding between the upper wafer and the lower wafer completes to form the post-bonded wafer pair, wherein the post-bonded wafer pair remains on the upper chuck until the vacuum pressure supplied to the upper chuck is removed.

20. The method of claim 19, wherein bonding forces between the upper wafer and the lower wafer cause a vacuum seal between the lower wafer and the lower chuck to break before bonding completes and/or before the vacuum pressure supplied to the upper chuck is removed.

* * * * *